United States Patent
Bong et al.

(10) Patent No.: US 9,686,833 B2
(45) Date of Patent: Jun. 20, 2017

(54) LED DRIVING APPARATUS AND LIGHTING APPARATUS INCLUDING THE SAME

(71) Applicant: Samsung Electronics Co., Ltd., Suwon-si (KR)

(72) Inventors: Sang Cheol Bong, Seoul (KR); Kyoung Tae Han, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/073,642

(22) Filed: Mar. 18, 2016

(65) Prior Publication Data

US 2016/0381750 A1 Dec. 29, 2016

(30) Foreign Application Priority Data

Jun. 26, 2015 (KR) .................. 10-2015-0091011

(51) Int. Cl.
*H05B 33/08* (2006.01)
*H05B 37/02* (2006.01)
(Continued)

(52) U.S. Cl.
CPC ........... *H05B 33/0845* (2013.01); *F21V 3/02* (2013.01); *F21V 9/16* (2013.01); *H01L 25/0753* (2013.01); *H01L 25/167* (2013.01); *H01L 33/62* (2013.01); *H05B 33/0809* (2013.01); *H05B 33/0824* (2013.01); *H05B 37/0272* (2013.01); *G02B 6/0083* (2013.01); *H01L 33/007* (2013.01); *H01L 33/06* (2013.01); *H01L 33/12* (2013.01); *H01L 33/325* (2013.01); *H01L 33/405* (2013.01); *H01L 33/42* (2013.01)

(58) Field of Classification Search
CPC .... H05B 37/02; H05B 33/08; H05B 33/0812; H05B 33/0815; H05B 33/083; H05B 33/0824; H05B 33/084
USPC ... 315/122, 185 R, 194, 201, 291, 294, 297, 315/307, 308, 312
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP 2009-123427 A 6/2009
JP 2013-218921 A 10/2013
(Continued)

*Primary Examiner* — Thai Pham
(74) *Attorney, Agent, or Firm* — Muir Patent Law, PLLC

(57) ABSTRACT

An LED driving apparatus according to an exemplary embodiment of the present inventive concept may include a rectifier circuit rectifying alternating current (AC) power to generate driving power for operating a plurality of LED arrays; a controller integrated circuit (IC) including a plurality of internal switches connected to respective output terminals of the plurality of LED arrays and controlling a path of a current flowing in the plurality of LED arrays by adjusting operations of the plurality of internal switches according to a magnitude of the driving power; and a current controlling circuit connected to the output terminal of at least one of the plurality of LED arrays and controlling a current flowing in the at least one LED array.

18 Claims, 23 Drawing Sheets

(51) Int. Cl.
*F21V 9/16* (2006.01)
*F21V 3/02* (2006.01)
*H01L 25/16* (2006.01)
*H01L 25/075* (2006.01)
*H01L 33/62* (2010.01)
*H01L 33/32* (2010.01)
*H01L 33/12* (2010.01)
*H01L 33/00* (2010.01)
*H01L 33/06* (2010.01)
*H01L 33/40* (2010.01)
*H01L 33/42* (2010.01)
*F21V 8/00* (2006.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,324,840 B2 | 12/2012 | Shteynberg et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,638,043 B2 | 1/2014 | Chiang et al. |
| 8,735,931 B2 | 5/2014 | Han et al. |
| 8,736,178 B2 | 5/2014 | Lee |
| 8,766,295 B2 | 7/2014 | Kim |
| 8,847,509 B2 | 9/2014 | Sakuragi et al. |
| 8,994,289 B2 | 3/2015 | Wey |
| 2010/0134018 A1* | 6/2010 | Tziony ............... H05B 33/083 315/122 |
| 2010/0308739 A1* | 12/2010 | Shteynberg ......... H05B 33/083 315/193 |
| 2012/0153833 A1* | 6/2012 | Mikani ............. H05B 33/0845 315/122 |
| 2014/0232278 A1 | 8/2014 | Jeong et al. |

FOREIGN PATENT DOCUMENTS

| | | |
|---|---|---|
| KR | 10-1357635 B1 | 2/2014 |
| KR | 10-1426477 B1 | 8/2014 |
| KR | 10-2014-0123175 A | 10/2014 |

* cited by examiner

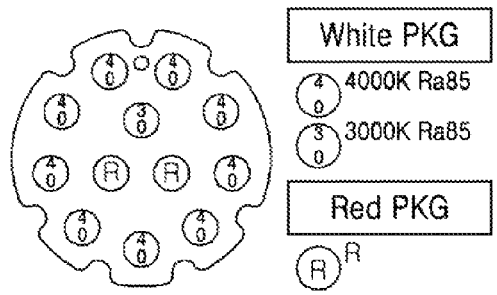
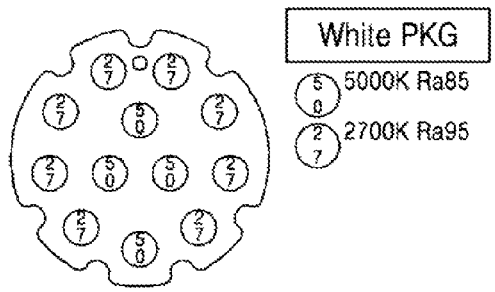
FIG. 13A    FIG. 13B
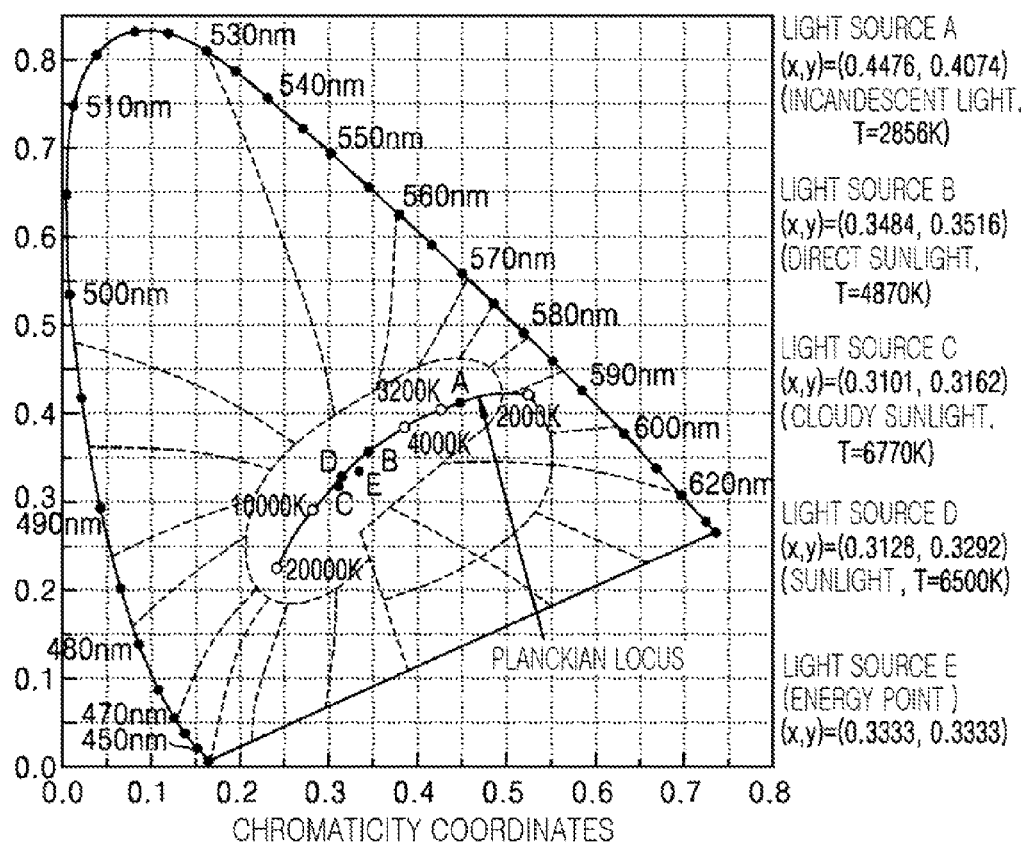
FIG. 14

LED DRIVING APPARATUS AND LIGHTING APPARATUS INCLUDING THE SAME

CROSS-REFERENCE TO RELATED APPLICATION

This application claims the priority and benefit of Korean Patent Application No. 10-2015-0091011 filed on Jun. 26, 2015, with the Korean Intellectual Property Office, the disclosure of which is incorporated herein by reference in its entirety.

BACKGROUND

The present disclosure relates to an LED driving apparatus and a lighting apparatus including the same.

Light emitting diodes (LEDs), generally described as semiconductor light emitting devices, may have advantages, such as relatively low power consumption, a relatively long lifespan, the implementation of light having various colors, and the like, as compared to existing light sources such as fluorescent and incandescent lamps. Based on the advantages as described above, the fields of application of LEDs have expanded to various lighting apparatuses, backlight units of display apparatuses, vehicle headlamps, and the like. In general, since LEDs may be operated by a constant current, an LED driving apparatus may include a rectifier circuit converting AC power into DC power and a converter circuit generating constant current power from an output of the rectifier circuit.

Recently, in order to reduce manufacturing costs by decreasing the amount of circuit components, as well as to increase reliability, LED driving apparatuses capable of driving LEDs without a converter circuit have been proposed. An LED driving apparatus having no converter circuit may include a controller integrated circuit (IC) having a plurality of switches and a plurality of LED arrays, light emission of which is controlled by the controller IC. The LED driving apparatus having no converter circuit may have advantages such as high reliability, low manufacturing costs, and the like, but due to limiting current properties of the controller IC, may be disadvantageous in that output of a drivable LED array is limited.

SUMMARY

An aspect of the present inventive concept may provide an LED driving apparatus capable of operating high output LEDs, simultaneously with driving the LEDs by AC power without a converter circuit, and a lighting apparatus including the same.

According to an aspect of the present inventive concept, a light emitting device driving apparatus may include: a rectifier circuit configured to rectify alternating current (AC) power to generate driving power for operating a plurality of light emitting diode (LED) arrays; a controller integrated circuit (IC) including a plurality of internal switches connected to respective output terminals of the plurality of LED arrays and configured to control a path of a current flowing in the plurality of LED arrays by adjusting operations of the plurality of internal switches according to a magnitude of the driving power; and a current controlling circuit connected to the output terminal of at least one of the plurality of LED arrays and configured to control a current flowing in the at least one LED array.

According to another aspect of the present inventive concept, a lighting apparatus may include: a light source including a plurality of light emitting diode (LED) arrays; a controller integrated circuit (IC) including a plurality of internal switches connected to respective output terminals of the plurality of LED arrays and configured to control a path of a current flowing in the plurality of LED arrays by adjusting operations of the plurality of internal switches according to a magnitude of the driving power; and a current controlling circuit connected to the output terminal of at least one of the plurality of LED arrays and configured to control a current flowing in the at least one LED array. According to yet another aspect, a lighting apparatus may include a rectifier circuit configured to rectify alternating current (AC) power to generate driving power for operating a plurality of light emitting device sets, each light emitting device set having an input terminal and output terminal and including one or more light emitting devices; a controller integrated circuit (IC) including a plurality of internal switches connected to respective output terminals of the plurality of light emitting device sets and configured to control a path of a current flowing in the plurality of light emitting device sets by adjusting operations of the plurality of internal switches according to a magnitude of the driving power; and a current controlling circuit connected to the output terminal of at least one of the plurality of light emitting device sets and configured to control a current flowing in the at least one light emitting device set. The light emitting device sets may be light emitting diode (LED) arrays.

BRIEF DESCRIPTION OF DRAWINGS

The above and other aspects, features, and advantages of the present inventive concept will be more clearly understood from the following detailed description taken in conjunction with the accompanying drawings, in which:

FIG. 13A and FIG. 13B are views schematically illustrating white light source modules applicable to a lighting apparatus according to certain exemplary embodiments of the present inventive concept;

FIG. 14 is a CIE 1931 color space chromaticity diagram provided for describing operations of the white light source modules illustrated in FIG. 13A and FIG. 13B, according to certain exemplary embodiments;

DETAILED DESCRIPTION

Figure 1:
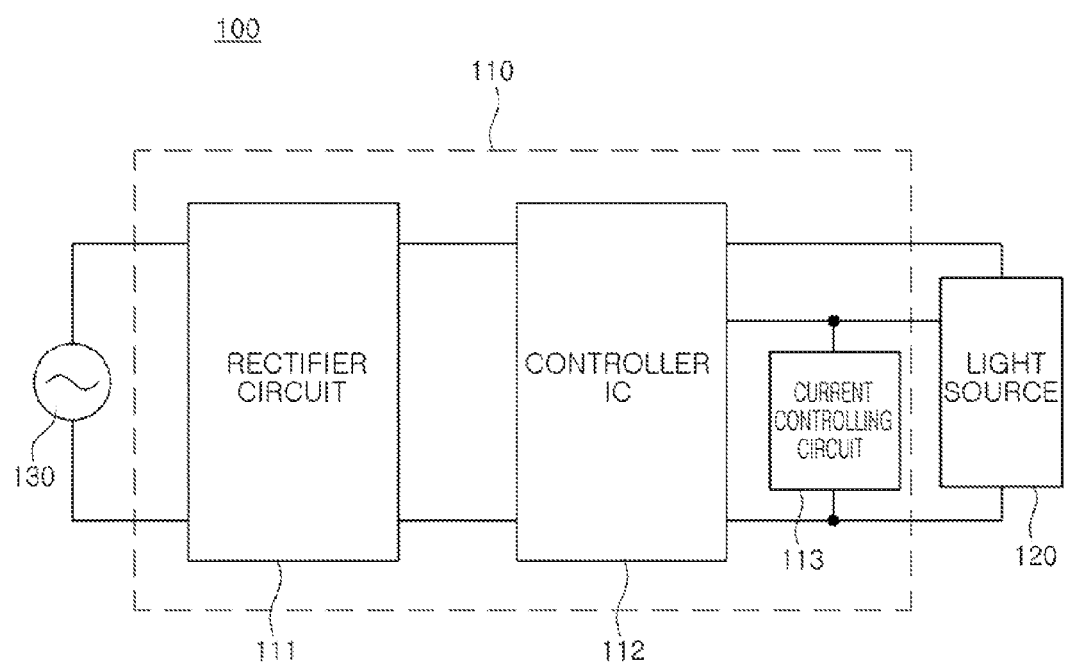
FIG. 1 is a block diagram illustrating a lighting apparatus according to certain exemplary embodiments of the present inventive concept.

Exemplary embodiments of the present inventive concept will now be described in detail with reference to the accompanying drawings.

The inventive concept may, however, be exemplified in many different forms and should not be construed as being limited to the specific embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the shapes and dimensions of elements may be exaggerated for clarity, and the same reference numerals will be used throughout to designate the same or like elements. Though the different drawings show variations of exemplary embodiments, these drawings are not necessarily intended to be mutually exclusive from each other. Rather, as will be seen from the context of the detailed description below, certain features depicted and described in different drawings can be combined with other features from other drawings to result in various embodiments, when taking the drawings and their description as a whole into consideration.

The terminology used herein is for the purpose of describing particular embodiments only and is not intended to be limiting of the invention. As used herein, the singular forms "a", "an" and the are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. Terms such as "exactly" or "identical" may be used to indicate no such variation.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a diode structure or a transistor structure) is illustrated in a cross-sectional view, an electronic device may include a plurality of the device structures (e.g., diode structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, unless indicated otherwise, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other either contact each other or are electrically connected through one or more passive elements, such as, for example, wires, pads, internal electrical lines, through vias, etc. As such, directly electrically connected components do not include components electrically connected through active elements, such as transistors or diodes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram illustrating a lighting apparatus according to an exemplary embodiment of the present inventive concept.

Referring to FIG. 1, a lighting apparatus 100 according to an exemplary embodiment of the present inventive concept may include an LED driving apparatus 110, a light source 120, and a power supply 130. The power supply 130 may be a commercial power supply supplying alternating current (AC) power and for example, may output AC power of 220V-60 Hz. The light source 120 may include one or more LED arrays. In an exemplary embodiment, the light source 120 may include a plurality of LED arrays connected to each other in series or in parallel, and each of the plurality of LED arrays may include one or more LEDs.

The LED driving apparatus 110 may include a rectifying circuit 111, a controller IC 112, and a current controlling circuit 113. The rectifying circuit 111 may full-wave rectify the AC power output by the power supply 130, and may supply driving power to the light source 120. By way of example, the rectifying circuit 111 may include a diode bridge. The controller IC 112 may control the LED array included in the light source 120 to be operated by the driving power output by the rectifying circuit 111, and may be implemented as an integrated circuit (IC). The controller IC 112 may include a plurality of internal switches, and the plurality of internal switches may be respectively connected to output terminals of the plurality of LED arrays included in the light source 120.

The current controlling circuit 113, a circuit provided separately from the controller IC 112, may include at least one switching element and a circuit element, such as a resistor or the like. When the current controlling circuit 113 is operated, a current flowing through the LED array included in the light source 120 may be dispersed into the controller IC 112 and the current controlling circuit 113, and stress applied to the controller IC 112 may be reduced. Therefore, since a relatively high level of current may be applied to the LED array, a brighter lighting apparatus 100 may be implemented by including a high output LED in the light source 120.

Figure 2:
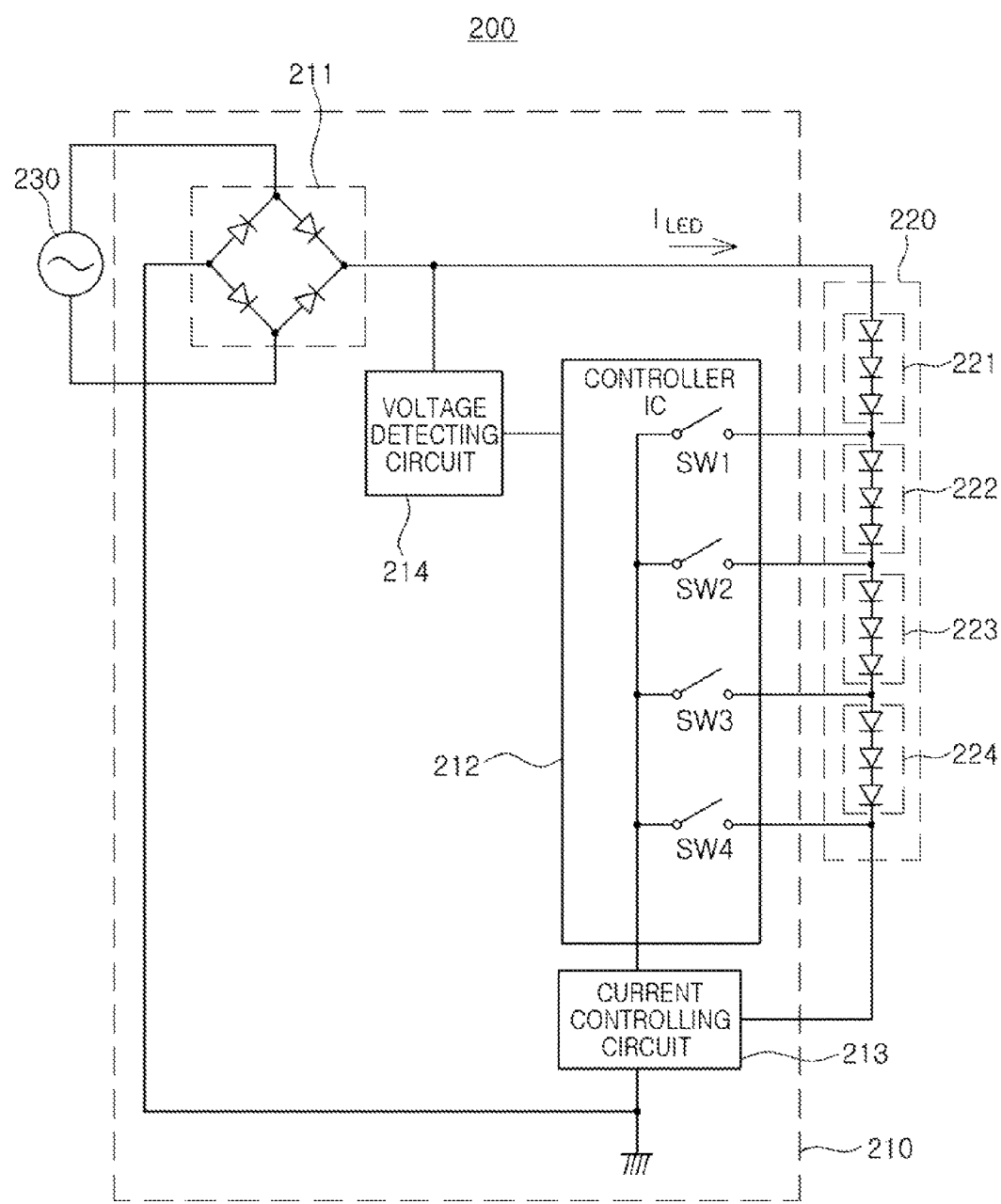
FIG. 2 and FIG. 3 are circuit diagrams illustrating an LED driving apparatus according to certain exemplary embodiments of the present invention concept.
Figure 3:
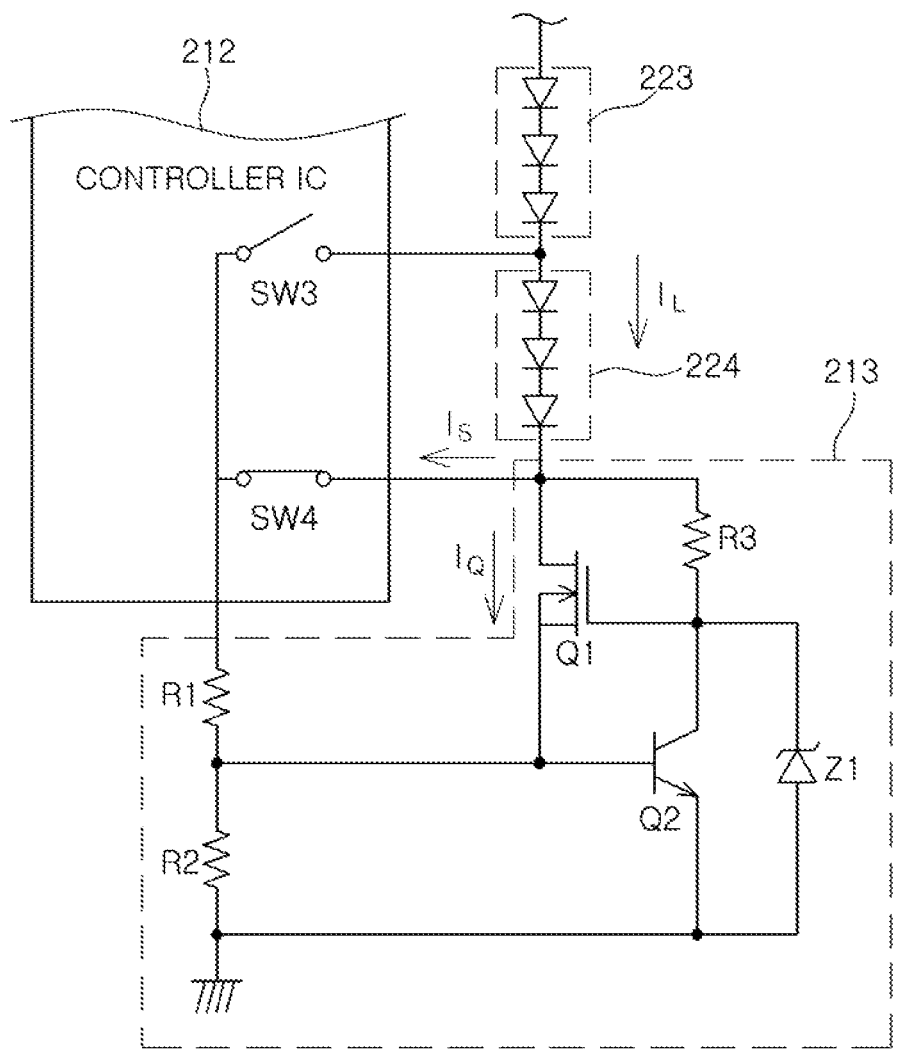

FIG. 2 and FIG. 3 are circuit diagrams illustrating an LED driving apparatus according to an exemplary embodiment of the present invention concept.

Referring to FIG. 2, an LED driving apparatus 210 according to an exemplary embodiment of the present inventive concept may include a rectifier circuit 211 implemented as a diode bridge, a controller IC 212, a current controlling circuit 213, a voltage detecting circuit 214, and the like. An input terminal and an output terminal of the LED driving apparatus 210 may be connected to a power supply 230 and a light source 220, respectively, and the light source 220 may include a plurality of LED arrays 221 to 224. The embodiment of FIG. 2 illustrates a case in which the plurality of LED arrays 221 to 224 are connected to one another in series within the light source 220, but unlike the case of FIG. 2, at least some of the plurality of LED arrays 221 to 224 may be connected to each other in parallel. Also, it should be noted that FIG. 2 illustrates a circuit configuration, and not necessarily a physical layout of the LED arrays 221 to 224. For example, the LED arrays 221 to 224 may be arranged physically in a straight line configuration, but alternatively may be arranged in different configurations, such as circular, spherical, zig-zag, or other configurations.

As described above, the rectifier circuit 211 may be implemented as a diode bridge and may full-wave rectify AC power output by the power supply 230 to generate driving power for operating the plurality of LED arrays 221 to 224. In certain embodiments, at least one of the LED arrays (e.g., 221 as depicted in FIG. 2) is directly electrically connected to the rectifier circuit 211, and/or is connected to the rectifier circuit 211 without a converter circuit therebetween. A voltage of the driving power output by the rectifier circuit 211 may have a waveform repeatedly increased and decreased in a single period, and the controller IC 212 may control operations of a plurality of internal switches SW1 to SW4 on the basis of a voltage magnitude of the driving power detected by the voltage detecting circuit 214, thereby determining whether or not to allow the plurality of LED arrays 221 to 224 to emit light. Hereinafter, a description will be made with reference to FIG. 4.

Figure 4:
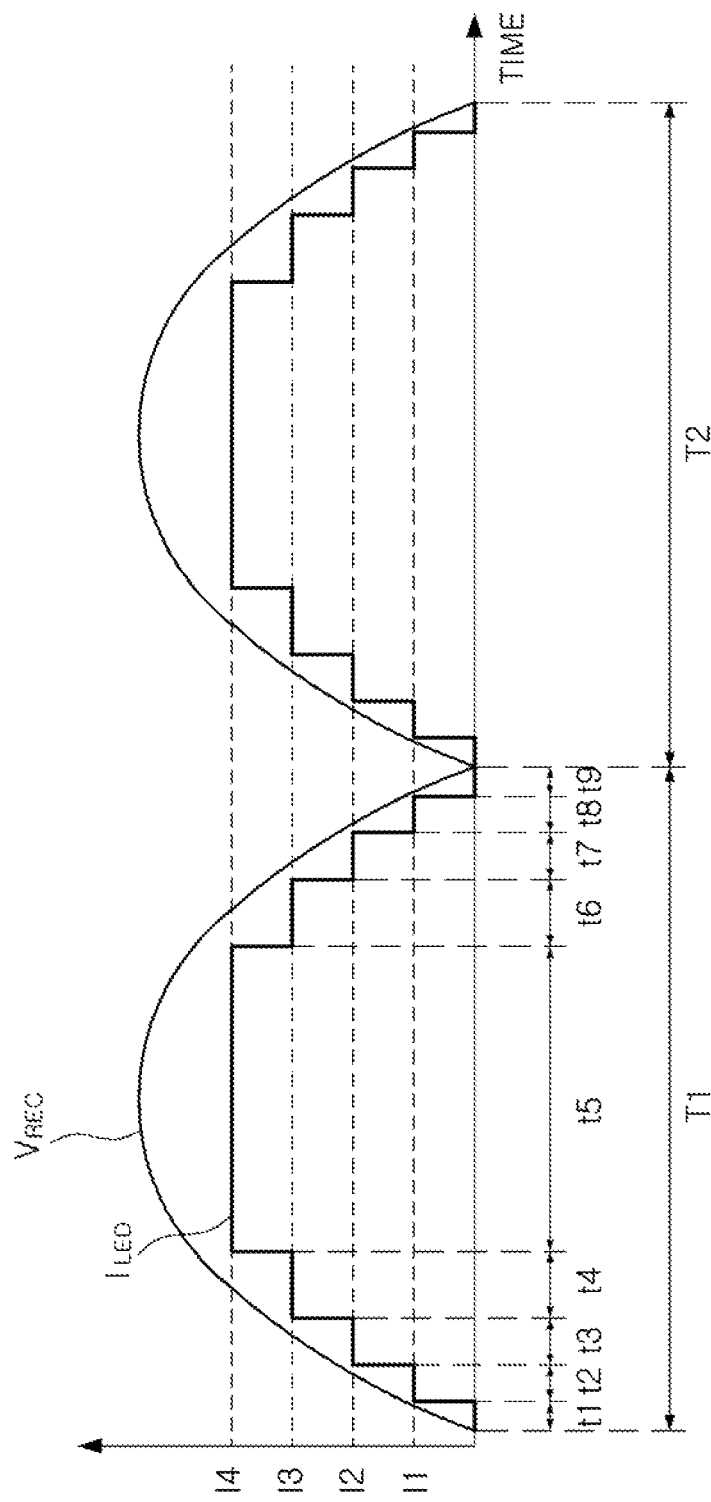
FIG. 4 is a waveform diagram provided for describing the LED driving apparatus illustrated in FIG. 2 and FIG. 3, according to certain exemplary embodiments.

FIG. 4 is a waveform diagram provided for describing the LED driving apparatus illustrated in FIG. 2 and FIG. 3. Referring to FIG. 4, driving power $V_{REC}$ supplied to the LED arrays 221 to 224 may have waveforms repeated in every predetermined cycle. In an exemplary embodiment, since driving power $V_{REC}$ may be generated by full-wave rectifying a commercial AC power of 220V-60 Hz, it may have a peak voltage of 220V and a frequency of 120 Hz.

Referring to FIG. 4, driving power $V_{REC}$ may include nine durations of t1-t9 in a single cycle T1. Since a voltage magnitude of the driving power $V_{REC}$ is relatively low in the first period t1 and the ninth period t9, a voltage sufficient to emit light from the LED arrays 221 to 224 may not be supplied. Therefore, driving current $I_{LED}$ may not be supplied to the LED arrays 221 to 224 in the first duration t1 and the ninth duration t9.

In the second duration t2 and the eighth duration t8, current $I_1$ may be supplied to the LED array 221 by the driving power $V_{REC}$. The voltage of the driving power $V_{REC}$ in the second duration t2 and the eighth duration t8 may be sufficient to drive the first LED array 221 but may be insufficient to drive the first and second LED arrays 221 and 222 together. Therefore, the controller IC 212 may set the current to flow through the first LED array 221 and the first internal switch SW1 by turning only the first internal switch SW1 on, among the first to fourth internal switches SW1 to SW4. For example, in certain embodiments, in the second duration t2 and the eighth duration t8, only the first LED array 221 are operated, and the second to fourth LED arrays 222 to 224 are not operated.

The voltage of the driving power $V_{REC}$ in the third duration t3 and the seventh duration t7 may be sufficient to drive the first and second LED arrays 221 and 222 but may be insufficient to drive the first to third LED arrays 221 to 223 together. Therefore, the controller IC 212 may turn only the second internal switch SW2 on and may turn the other switches SW1, SW3, and SW4 off, in the third duration t3 and the seventh duration t7. Consequently, a path of current $I_2$ applied to the light source 220 in the third duration t3 and the seventh duration t7 may be defined as a path passing through the first and second LED arrays 221 and 222 and the second internal switch SW2. Therefore, in the third duration t3 and the seventh duration t7, the first and second LED arrays 221 and 222 may be operated, and the third and fourth LED arrays 223 and 224 may not be operated.

Similarly, the voltage of the driving power $V_{REC}$ in the fourth duration t4 and the sixth duration t6 may be sufficient to drive the first to third LED arrays 221 to 223 but may be insufficient to drive all of the first to fourth LED arrays 221 to 224 together. The controller IC 212 may set current $I_3$ to pass through the first to third LED arrays 221 to 223 and the third internal switch SW1 by turning only the third internal switch SW1 on, in the fourth period t4 and the sixth period t6. Therefore, in the fourth duration t4 and the sixth duration t6, the first to third LED arrays 221 may be operated, and the fourth LED array 224 may not be operated.

The voltage magnitude of the driving power $V_{REC}$ in the fifth duration t5 may be sufficient to drive all of the first to fourth LED arrays 221 to 224. Therefore, during the fifth period t5, the controller IC 212 may control all of the first to fourth LED arrays 221 to 224 to be operated by current $I_4$ by turning the first to third internal switches SW1 to SW3 off and turning the fourth internal switch SW4 on.

As illustrated in the waveform diagram of FIG. 4, currents flowing in the controller IC 212 may be different in the plurality of respective durations t1-t9 included in a single cycle of the driving power $V_{REC}$. For example, in the fifth duration t5, the current $I_4$ having the highest level may flow through the fourth internal switch SW4 of the controller IC 212. Therefore, a magnitude of the current $I_4$ may be determined by a limiting current that may flow in the controller IC 212, and consequently, a maximum output of the light source 220 may be determined by the limiting current that may flow in the controller IC 212.

As illustrated in FIG. 2, the LED driving apparatus 210 may include the current controlling circuit 213 connected to an output terminal of the fourth LED array 224 and the fourth internal switch SW4. As shown in FIG. 2, each switch SW1 through SW4 may have one terminal connected to the current controlling circuit 213, and one terminal connected to the light source 220, for example, at an output terminal of a particular LED array. The current controlling circuit 213 may draw a portion of the current flowing in the LED arrays 221 to 224 in the fifth duration t5 in which the fourth internal switch SW4 is turned on, and thus, may decrease the current flowing in the fourth internal switch SW4 during the fifth duration t5. As such, in the fifth duration t5 in which the controller IC 212 receives the highest current stress, since a portion of the current $I_4$ introduced to the controller IC 212 is dispersed into the current controlling circuit 213, the limiting current of the LED driving apparatus 210 may be increased. Therefore, the LED driving apparatus 210 according to the exemplary embodiment of the present inventive concept may drive the light source 220 having a higher output.

Hereinafter, with reference to FIG. 3, a specific circuit configuration of the current controlling circuit 213 will be described.

Referring to FIG. 3, the current controlling circuit 213 according to certain exemplary embodiments may include switching elements Q1 and Q2 (also referred to as switches), resistors R1 to R3, and a zener diode Z1. The zener diode Z1 may be a clamping diode. The current controlling circuit 213 may be connected between a first terminal of a first internal switch of the plurality of internal switches (e.g., SW4) and a second terminal of the first internal switch of the plurality of internal switches. In addition, as described in more detail below, the current controlling circuit 213 may include a voltage divider connected between the first terminal of the first internal switch and a ground, and may further include at least one switch (e.g., Q1) connected to the second terminal of the first internal switch.

When the third internal switch SW3 is turned off and the fourth internal switch SW4 is turned on, current $I_L$ may flow through a path including the first to fourth LED arrays 221 to 224 and the fourth internal switch SW4. Here, a magnitude of the current $I_L$ may be identical to the magnitude of the current $I_4$ illustrated in the waveform of FIG. 4. When the current $I_L$ flows, a gate voltage of the first switching element Q1 may start to be increased by the resistor R3 and the zener diode Z1, and the first switching element Q1 may be turned on. When the first switching element Q1 is turned on, the current $I_L$ may be dispersed into current $I_S$ flowing in (e.g., through) the fourth internal switch SW4 of the controller IC 212 and current $I_O$ flowing in (e.g., through) the first switching element Q1. Therefore, the current flowing in the controller IC 212 may be reduced, whereby current stress of the controller IC 212 may be lowered.

In this case, a ratio of the current $I_S$ flowing in the fourth internal switch SW4 and the current $I_O$ flowing in the first switching element Q1 may be determined by a ratio of the resistors R1 and R2. Since both ends of the resistor R2 may be respectively connected to base and emitter terminals of the second switching element Q2 implemented as a bipolar transistor, a voltage at a terminal between the resistors R1 and R2 may be approximately 0.7V, and the current $I_S$ flowing in the fourth internal switch SW4 may be determined as in the following mathematical equation 1. In the following mathematical equation 1, $V_{REF}$ may be a rated voltage of the controller IC 212.

$$I_S = \frac{V_{REF} - 0.7}{R_1} \qquad \text{[Mathematical Equation 1]}$$

Meanwhile, the current $I_Q$ flowing in the first switching element Q1 may be determined as in the following mathematical equation 2.

$$I_Q = \frac{0.7}{R_2} - \frac{V_{REF} - 0.7}{R_1} \quad \text{[Mathematical Equation 2]}$$

As such, the ratio of the current $I_S$ flowing in the fourth internal switch SW4 and the current $I_Q$ flowing in the first switching element Q1 may be determined by the resistors R1 and R2. Meanwhile, when it is defined by maximum current I that may flow in the controller IC 212, a value of the resistor R1 may be determined to satisfy the condition as in the following mathematical equation 3.

$$R_1 \geq \frac{V_{REF} - 0.7}{I_{MAX}} \quad \text{[Mathematical Equation 3]}$$

Thus, after the value of the resistor R1 is first determined to satisfy the following mathematical equation 3, a value of the resistor R2 may be determined to thereby configure the current controlling circuit 213. A circuit configuration of the current controlling circuit 213 is not limited to that illustrated in FIG. 3, and may be implemented in other various forms. Since a main function of the current controlling circuit 213 is to draw and disperse a portion of the current flowing in the controller IC 212, any circuit may be employed as the current controlling circuit 213, as long as the circuit may be connected to one of the internal switches SW1 to SW4 and is configured to disperse an internal current flowing in the controller IC 212 when the corresponding internal switch SW1 to SW4 is turned on.

The exemplary embodiment illustrated in FIG. 2 and FIG. 3 illustrates a case in which the current controlling circuit 213 is connected to only the fourth LED array 224 and the fourth internal switch SW4, but unlike this, the current controlling circuit 213 may also be connected to other LED arrays 221 to 223 and other internal switches SW1 to SW3. The current controlling circuit 213 may be connected to the LED arrays 221 to 223 and the internal switches SW1 to SW3, whereby a magnitude of the currents $I_1$-$I_3$ supplied to the light source 220 in other durations not the fifth duration t5 may be increased, and accordingly, an average magnitude of current $I_{LED}$ supplied to the light source 220 within a single cycle of the driving power $V_{REC}$ may be increased to increase the output of the light source 220.

Figure 5:
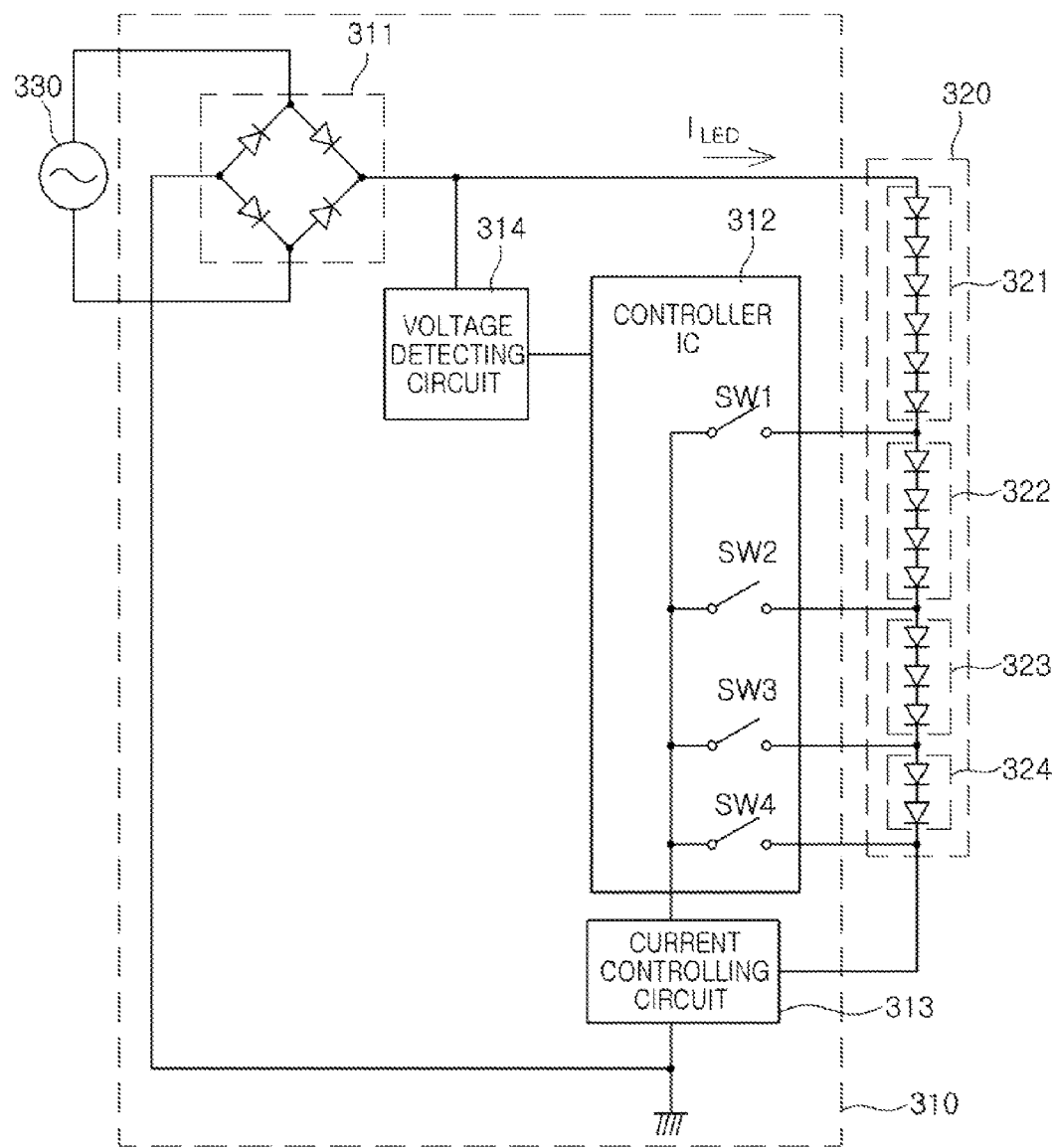
FIG. 5 is a circuit diagram illustrating an LED driving apparatus according to certain exemplary embodiments of the present invention concept.

FIG. 5 is a circuit diagram illustrating an LED driving apparatus according to certain exemplary embodiments.

Referring to FIG. 5, an LED driving apparatus 310 according to an exemplary embodiment may include a rectifier circuit 311, a controller IC 312, a current controlling circuit 313, a voltage detecting circuit 314, and the like. Similar to the circuit diagram of FIG. 2, the rectifier circuit 311 may full-wave rectify AC power output by a power supply 330 to generate driving power. The controller IC 312 may determine the turning on/off of the internal switches SW1 to SW4 on the basis of a voltage magnitude of the driving power detected by the voltage detecting circuit 314, and thus, may control operations of LED arrays 321 to 324 included in the light source 320. The current controlling circuit 313 may be connected to one of the internal switches SW1 to SW4, and may disperse the current $I_{LED}$ flowing in the LED arrays 321 to 324, whereby current stress applied to the controller IC 312 may be reduced.

The light source 320 connected to the LED driving apparatus 310 illustrated in FIG. 5 may include the LED arrays 321 to 324 having different numbers of LEDs. As illustrated in FIG. 5, the first LED array 321 may include the largest number of LEDs, and the fourth LED array 324 may include the smallest number of LEDs. The number of LEDs included in each of the LED arrays 321 to 324 may be determined as described above, and a power factor of the LED driving apparatus 310 may be increased. Meanwhile, the number of LEDs included in each of the LED arrays 321 to 324 may be variously modified. Also, in some embodiments, the numbers of some of LEDs in two or more different LED arrays may be the same, while the numbers of some LEDs in other LED arrays may be different. In some embodiments, at least one LED array includes a smaller number of LEDs than at least some of the remaining LED arrays of the plurality of LED arrays. The LED arrays described herein or light emitting device arrays described herein may generally be referred to as LED sets or light emitting device sets. As discussed in the embodiments above, each LED set or light emitting device set may have a plurality of LEDs/light emitting devices forming an array. In some embodiments, one of more LED or light emitting device sets may include only one LED/light emitting device.

Figure 6:
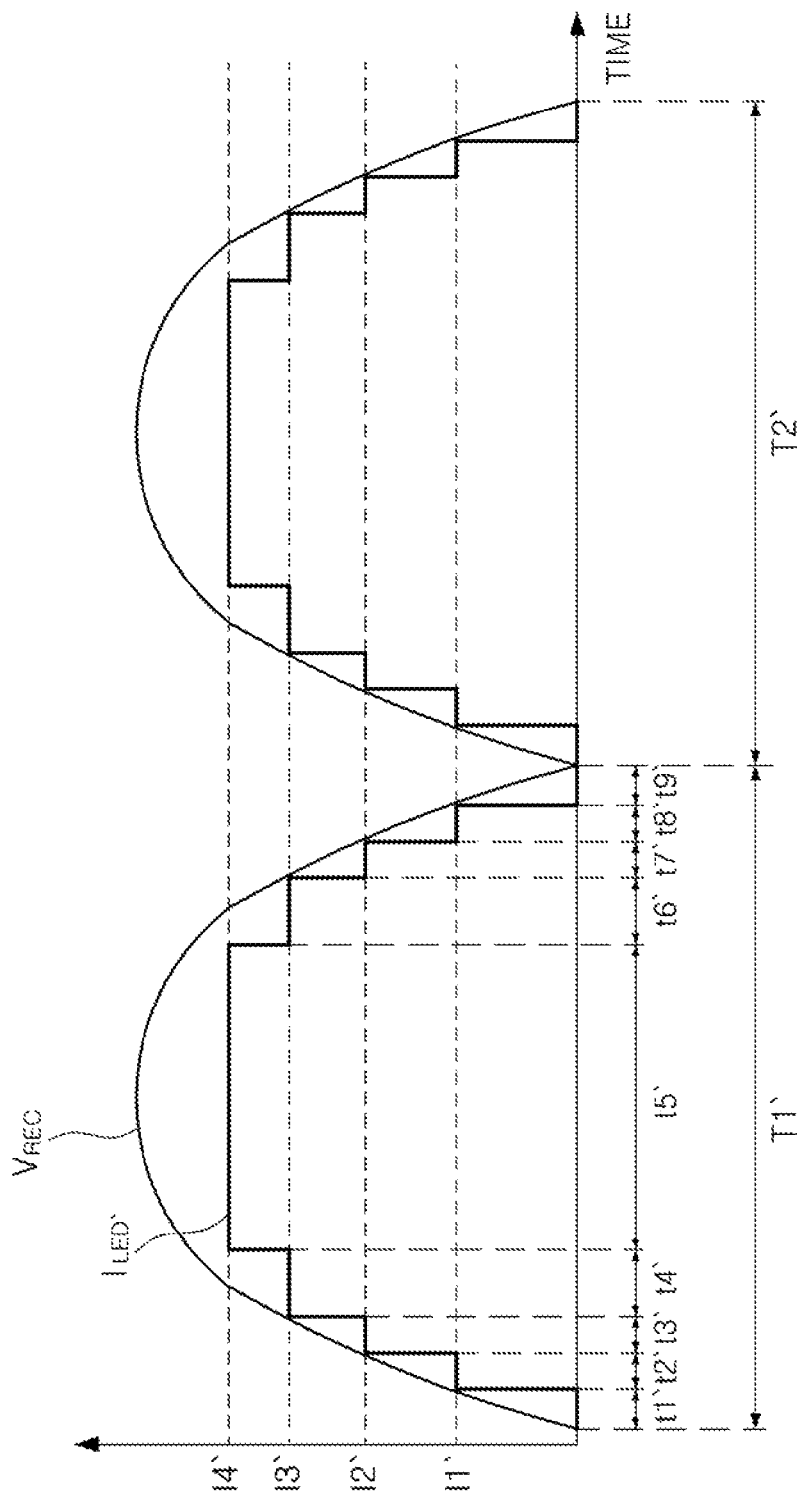
FIG. 6 is a waveform diagram provided for describing the LED driving apparatus illustrated in FIG. 5, according to certain exemplary embodiments.

FIG. 6 is a waveform diagram provided for describing the LED driving apparatus illustrated in FIG. 5. The waveform diagram of FIG. 6 is partially similar to the waveform diagram of FIG. 4. For example, in the waveform diagram of FIG. 6, a single cycle of the driving power $V_{REC}$ may be divided into a total of nine durations t1'-t9'.

Relatively, since the first LED array 321 may include the largest number of LEDs, the first internal switch SW1 may be turned on in the second and eighth durations t2' and t8', and a level of current $I_1$ output by the LED driving apparatus 310 may be greater than that of the current $I_1$. Therefore, errors of the current $I_{LED}$ and the voltage $V_{REC}$ of the driving power supplied to the LED arrays 321 to 324 in respective periods may be reduced, and consequently, the power factor may be improved.

In the embodiments of FIGS. 5 and 6, the operations of the current controlling circuit 313 may be similar to those described with reference to FIG. 2 through FIG. 4. The current controlling circuit 313 may draw a portion of current $I_4$' flowing in the LED arrays 321 to 324 in the fifth period t5' in which the fourth internal switch SW4 is turned on and all of the first to fourth LED arrays 321 to 324 are operated. Therefore, the current flowing in the controller IC 312 may be reduced to lower current stress of the controller IC 312, and the LED arrays 321 to 324 having an increased output may be employed as the light source 320, thereby implementing a high output lighting apparatus 300.

FIG. 7 through FIG. 12 are views illustrating semiconductor light emitting devices applicable to a lighting apparatus according to certain exemplary embodiments of the present inventive concept. As described herein, light emitting devices may be in the form of light emitting diodes. As described in connection with some of the embodiments below, light emitting devices described herein may be semiconductor-type light emitting devices, and may emit light from an active layer of a semiconductor-type device.

Figure 7:
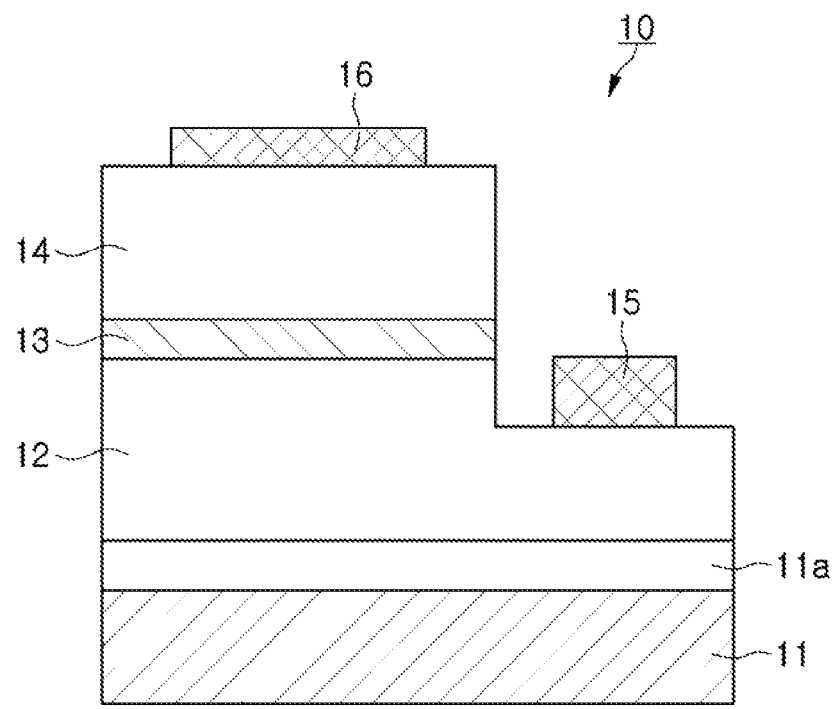
FIG. 7 through FIG. 12 are views illustrating semiconductor light emitting devices applicable to a lighting apparatus according to certain exemplary embodiments of the present inventive concept.

Referring to FIG. 7 first, a light emitting device 10 according to an exemplary embodiment of the present inventive concept may include a substrate 11, a first conductivity-type semiconductor layer 12, an active layer 13, and a second conductivity-type semiconductor layer 14. In addition, a first electrode 15 may be formed on the first conductivity-type semiconductor layer 12, and a second electrode 16 may be formed on the second conductivity-type semiconductor layer 14. An ohmic-contact layer may be further selectively provided between the second electrode 16 and the second conductivity-type semiconductor layer 14.

First, according to various exemplary embodiments, the substrate 11 may be at least one selected from an insulating substrate, a conductive substrate, or a semiconductor substrate. The substrate 11 may be, for example, sapphire, SiC, Si, $MgAl_2O_4$, MgO, $LiAlO_2$, $LiGaO_2$, or GaN. A homogeneous substrate, a GaN substrate, may be selected as the substrate 11 for epitaxial growth of a GaN material, and a heterogeneous substrate may be, mainly, sapphire, silicon carbide (SiC) or the like. In the case of using the heterogeneous substrate, defects such as dislocations may be caused due to a difference in lattice constants between a substrate material and a film material. In addition, warpage may occur at the time of temperature variation due to a difference in coefficients of thermal expansion between the substrate material and the film material, and such a warpage phenomenon may cause cracks in the film. In order to reduce or remove such defects, a buffer layer 11a may be disposed between the substrate 11 and the first conductivity-type semiconductor layer 12 provided as a GaN based layer.

In the case of growing the first conductivity-type semiconductor layer 12 containing GaN on the heterogeneous substrate, dislocation density may be increased due to a mismatch in lattice constants between the substrate material and the film material, and cracks and warpage may occur due to the difference in coefficients of thermal expansion. In order to prevent the dislocation and cracks as described above, the buffer layer 11a may be disposed between the substrate 11 and the first conductivity-type semiconductor layer 12. The buffer layer 11a may adjust a degree of warpage of the substrate when an active layer is grown, and may reduce wavelength dispersion of a wafer.

The buffer layer 11a may be made of $Al_xIn_yGa_{1-x-y}N$ (0≤x≤1, 0≤y≤1), in particular, GaN, AlN, AlGaN, InGaN, or InGaN/AlN, and a material such as $ZrB_2$, $HfB_2$, ZrN, HfN, TiN, or the like, may also be used. Also, the buffer layer may be formed by combining a plurality of layers or by gradually changing a composition.

A silicon (Si) substrate has a coefficient of thermal expansion significantly different from that of GaN. Thus, in a case of growing a GaN-based film on the silicon substrate, when a GaN film is grown at a high temperature and is subsequently cooled to room temperature, tensile stress is applied to the GaN film due to the difference in the coefficients of thermal expansion between the silicon substrate and the GaN film, causing cracks. In this case, in order to prevent the occurrence of cracks, a method of growing the GaN film such that compressive stress is applied to the GaN film while the GaN film is being grown is used to compensate for tensile stress. A significant difference in lattice constants between silicon (Si) and GaN involves a high possibility of the occurrence of defects. In the case of using a silicon substrate, the buffer layer 11a having a composite structure may be used in order to control stress for restraining warpage as well as controlling defects.

First, an AlN layer may be formed on the substrate 11 in order to form the buffer layer 11a. In this case, a material not including gallium (Ga) may be used in order to prevent a reaction between silicon (Si) and gallium (Ga). Besides AlN, a material such as SiC, or the like, may also be used. The AlN layer may be grown at a temperature ranging from about 400° C. to about 1300° C. by using an aluminum (Al) source and a nitrogen (N) source. An AlGaN interlayer may be inserted between a plurality of AlN layers in order to control stress in the middle of GaN.

The first conductivity-type semiconductor layer 12 and the second conductivity-type semiconductor layer 14 may be an n-type impurity doped semiconductor layer and a p-type impurity doped semiconductor layer, respectively, but are not limited thereto. The first conductivity-type semiconductor layer 12 and the second conductivity-type semiconductor layer 14 may be a p-type semiconductor layer and an n-type semiconductor layer, respectively. By way of example, the first conductivity-type semiconductor layer 12 and the second conductivity-type semiconductor layer 14 may be formed of a group III nitride semiconductor, such as a material having a composition of $Al_xIn_yGa_{1-x-y}N$ (0≤x≤1, 0≤y≤1, 0≤x+y≤1). The materials of the first conductivity-type semiconductor layer 12 and the second conductivity-type semiconductor layer 14 are not limited thereto, and may be, for example, an AlGaInP based semiconductor or an AlGaAs based semiconductor.

The first and second conductivity-type semiconductor layers 12 and 14 may have a single layer structure, but may alternatively have a multilayer structure in which respective layers have different compositions, thicknesses, or the like, if desired or necessary. For example, each of the first and second conductivity-type semiconductor layers 12 and 14 may include a carrier injection layer capable of improving injection efficiency of electrons and holes, and further, may have a superlattice structure formed in various manners.

The first conductivity-type semiconductor layer 12 may further include a current spreading layer in a portion thereof adjacent to the active layer 13. The current spreading layer may have a structure, for example, in which a plurality of $Al_xIn_yGa_{1-x-y}N$ layers having different compositions or different impurity contents are repeatedly stacked, or may be partially formed of an insulating material layer.

The second conductivity-type semiconductor layer 14 may further include an electron blocking layer in a portion thereof adjacent to the active layer 13. The electron blocking layer may have a structure, for example, in which a plurality of $Al_xIn_yGa_{1-x-y}N$ layers having different compositions are stacked or may have at least one layer configured of $Al_yGa_{(1-y)}N$. The second conductivity-type semiconductor layer 14 may have a band gap greater than that of the active layer 13 to prevent electrons from passing over the second conductivity-type semiconductor layer 14.

In an exemplary embodiment, the first and second conductivity-type semiconductor layers 12 and 14 and the active layer 13 may be formed using an MOCVD device. In order to manufacture the first and second conductivity-type semiconductor layers 12 and 14 and the active layer 13, according to certain embodiments, an organic metal compound gas (for example, trimethylgallium (TMG), trimethyl aluminum (TMA), or the like) and a nitrogen-containing gas (ammonia ($NH_3$) or the like) are supplied as a reaction gas to a reaction container in which the growth substrate 11 is installed, and a temperature of the substrate is maintained at a high temperature of 900° C. to 1100° C., and thus gallium nitride compound semiconductors may be grown on the substrate while supplying an impurity gas thereto if necessary, to thereby allow the gallium nitride compound semiconductors to be stacked as an undoped layer, an n-type layer, and a p-type layer, on the substrate. An n-type impurity may be Si, widely known in the art, and a p-type impurity may be Zn, Cd, Be, Mg, Ca, Ba, or the like. As the p-type impurity, Mg and Zn may be mainly used.

In addition, the active layer 13 interposed between the first and second conductivity-type semiconductor layers 12 and 14 may have a multiple quantum well (MQW) structure in which quantum well layers and quantum barrier layers are alternately stacked. For example, in the case in which the active layer 13 includes a nitride semiconductor, the active layer 13 may have a structure of GaN and InGaN. Depending on exemplary embodiments, the active layer 13 may have a single quantum well (SQW) structure. The first or second electrode 15 or 16 may contain a material such as Ag, Ni, Al, Rh, Pd, Ir, Ru, Mg, Zn, Pt, Au, or the like. The light emitting device 10 illustrated in FIG. 7 may have an Epi-Up structure, and accordingly, may be electrically connected to a circuit pattern included in a circuit board by a wire or the like within a light emitting device package.

Figure 8:
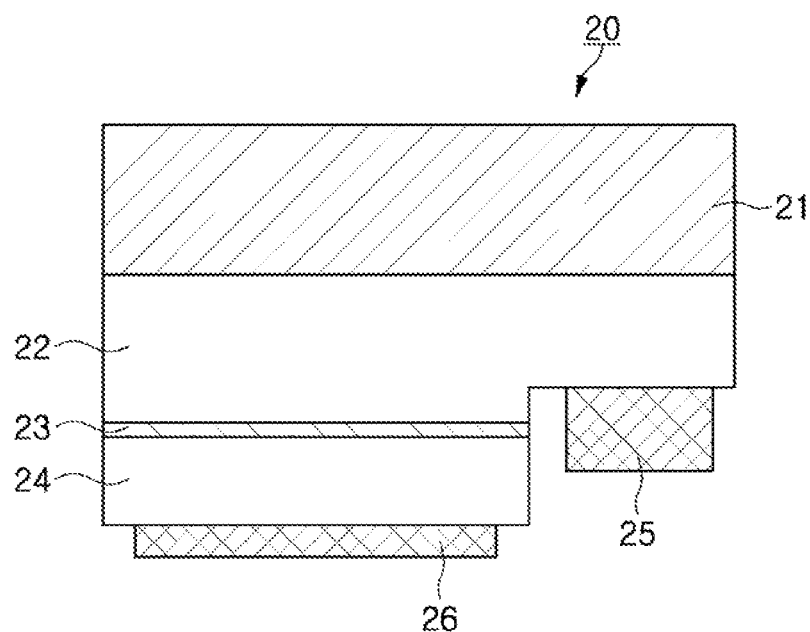

Then, referring to FIG. 8, a light emitting device 20 according to another exemplary embodiment of the present inventive concept may include a support substrate 21, first and second conductivity-type semiconductor layers 22 and 24, an active layer 23, first and second electrodes 25 and 26, and the like. The light emitting device 20 according to the exemplary embodiment illustrated in FIG. 8 may be attached to a circuit board of a light emitting device package by flip-chip bonding. Since light generated in the active layer 23 needs to be emitted upwardly, the support substrate 21 may be formed of a material having light-transmissive properties.

In addition, in order to reflect light generated in the active layer 23 and moving in a downward direction, the second electrode 26 may be formed of a material having excellent electrical conductivity and reflectance properties. In an example, the second electrode 26 may be formed of at least one among Ag, Ni, Al, Rh, Pd, Ir, Ru, Mg, Zn, Pt, and Au.

Figure 9:
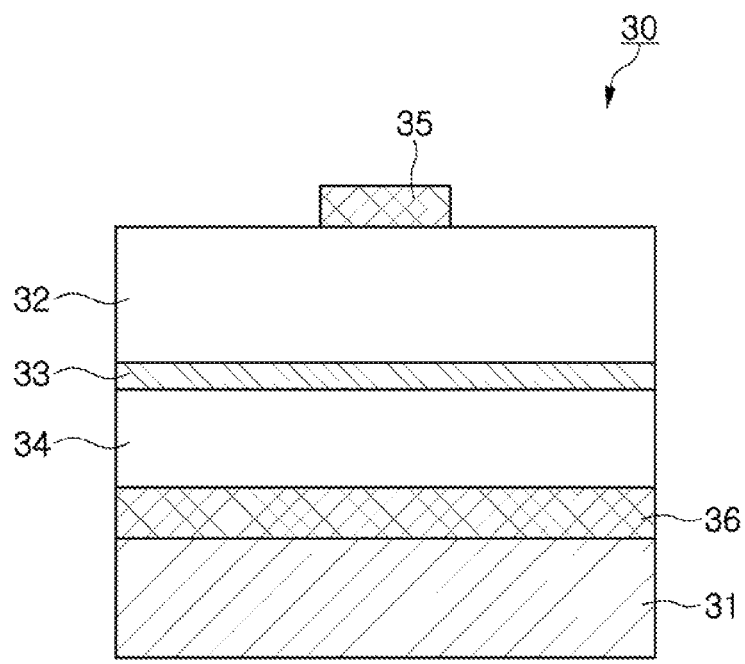

Then, referring to FIG. 9, a light emitting device 30 according to another exemplary embodiment is illustrated. The light emitting device 30 according to the embodiment illustrated in FIG. 9 may include a first conductivity-type semiconductor layer 32, an active layer 33, a second conductivity-type semiconductor layer 34, a first electrode 35 attached to the first conductivity-type semiconductor layer 32, and a second electrode 36 attached to the second conductivity-type semiconductor layer 34, and the like. A conductive substrate 31 may be disposed on a lower surface of the second electrode 36, and may be directly mounted on a circuit board for configuring a light emitting device package. Within the light emitting device package, the conductive substrate 31 may be directly mounted on the circuit board, and the first electrode 35 may be electrically connected to the circuit pattern of the circuit board by a wire, or the like.

In a similar manner to the case of the semiconductor light emitting devices 10 and 20, the first conductivity-type semiconductor layer 32 and the second conductivity-type semiconductor layer 34 may include an n-type nitride semiconductor and a p-type nitride semiconductor, respectively. The active layer 33 interposed between the first and second conductivity-type semiconductor layers 32 and 34 may have a multiple quantum well (MQW) structure in which nitride semiconductor layers having different compositions are alternately stacked, and may selectively have a single quantum well (SQW) structure.

The first electrode 35 may be disposed on an upper surface of the first conductivity-type semiconductor layer 32, and the second electrode 36 may be disposed on a lower surface of the second conductivity-type semiconductor layer 34. Light generated due to the recombination of electrons and holes in the active layer 33 of the light emitting device 30 shown in FIG. 9 may be emitted to an upper surface of the first conductivity-type semiconductor layer 32 on which the first electrode 35 is disposed. Thus, in order to reflect light generated in the active layer 33 in a direction toward the upper surface of the first conductivity-type semiconductor layer 32, the second electrode 36 may be formed of a material having a high degree of reflectance. The second electrode 36 may contain at least one of Ag, Al, Ni, Cr, Cu, Au, Pd, Pt, Sn, Ti, W, Rh, Ir, Ru, Mg, and Zn, or an alloy containing these materials.

Figure 10:
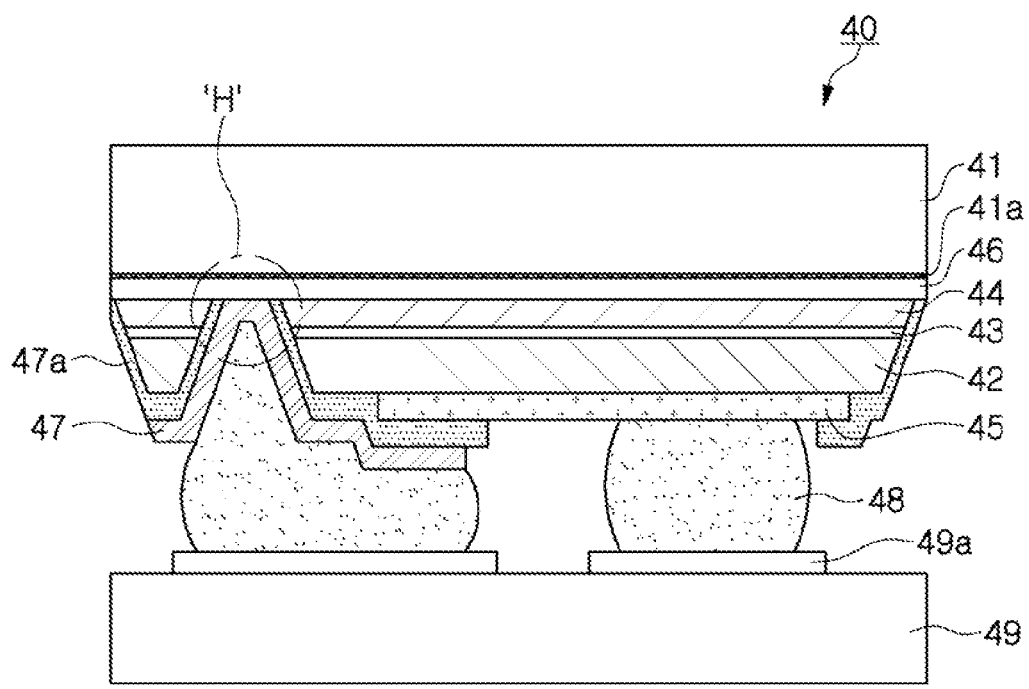

Then, referring to FIG. 10, a light emitting device 40 according to the exemplary embodiment may include a first conductivity-type semiconductor layer 42, a second conductivity-type semiconductor layer 44, an active layer 43 interposed therebetween, and first and second electrodes 45 and 46 connected to the first and second conductivity-type semiconductor layers 42 and 44, respectively. In the exemplary embodiment, the first and second electrodes 45 and 46 may be disposed on opposite surfaces of the first and second conductivity-type semiconductor layers 42 and 44, and the active layer 43 may be interposed between the first and second electrodes 45 and 46. A support substrate 41 may be attached to the second electrode 46 by a bonding layer 41a and may support the light emitting device 40.

The light emitting device 40 according to the exemplary embodiment of FIG. 10 may further include a connecting electrode 47 as an electrode element in association with the second electrode 46. The connecting electrode 47 may be connected to the second electrode 46 through a through-hole H formed by at least partially removing the first and second conductive-type semiconductor layers 42 and 44 and the active layer 43. At least a portion of the second electrode 46 may be exposed through the through-hole H, and, in the exposed portion, the second electrode 46 and the connecting electrode 47 may be connected to each other. The connecting electrode 47 may be formed along a sidewall of the through-hole H, and an insulating layer 47a may be provided between the connecting electrode 47 and the sidewall of the through hole H in order to prevent electrical connections between the connecting electrode 47 and the active layer 43 and the first conductivity-type semiconductor layer 42.

Such an electrode structure may be further efficiently applied to a form in which the first and second conductivity-type semiconductor layers 42 and 44 are n-type and p-type nitride semiconductor layers, respectively. Since the p-type nitride semiconductor layer has a degree of contact resistance greater than that of the n-type nitride semiconductor layer, it may be difficult to obtain ohmic-contact. However, in the exemplary embodiment illustrated in FIG. 10, since the second electrode 46 is disposed over the entire surface of the support substrate 41, a contact area between the second conductivity-type semiconductor layer 44 and the second electrode 46 may be sufficiently secured, whereby ohmic-contact between the second electrode 46 and the p-type nitride semiconductor layer may be obtained.

The light emitting device 40 according to the exemplary embodiment illustrated in FIG. 10 may have a flip-chip structure in which light is emitted in a direction toward the support substrate 41. For example, the first electrode 45 and the connecting electrode 47 may be electrically connected to circuit patterns 49a of a circuit board 49 by solder bumps 48. Thus, the first electrode 45 may contain an electrode material having a high degree of reflectance as well as ohmic-contact characteristics. The second electrode 46 and the support substrate 41 may have high light-transmissive properties. For example, the first electrode 45 may contain a material such as Ag, Ni, Al, Rh, Pd, Ir, Ru, Mg, Zn, Pt, Au, or the like. The second electrode 46 may be formed of a light-transmissive metal such as Ni/Au, or may be formed of a transparent conductive oxide or nitride such as ITO. The support substrate 41 may be a glass substrate or a substrate formed of a light-transmissive polymer resin.

The connecting electrode 47 may be electrically insulated from the first conductivity-type semiconductor layer 42 and the active layer 43 by the insulating layer 47a. As illustrated in FIG. 8, the insulating layer 47a may be formed along the sidewall of the through-hole H. In addition, the insulating layer 47a may be formed on side surfaces of the first and second conductivity-type semiconductor layers 42 and 44 and the active layer 43, and may be provided as a passivation layer for the light emitting device 10. The insulating layer 47a may contain, for example, a silicon oxide or a silicon nitride.

Figure 11:
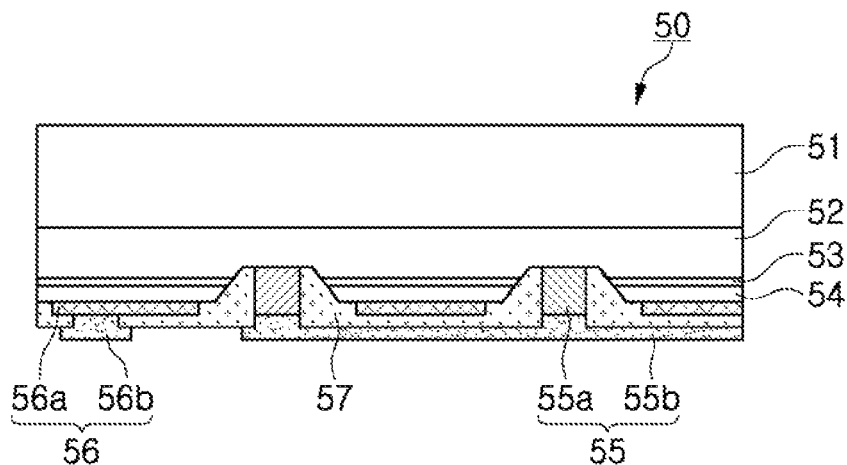

Referring to FIG. 11, a light emitting device 50 according to another exemplary embodiment is disclosed. The light emitting device 50 may include a first conductivity-type semiconductor layer 52, an active layer 53, and a second conductivity-type semiconductor layer 54 sequentially stacked on one surface of a substrate 51, and first and second electrodes 55 and 56. In addition, the light emitting device 50 may include an insulating portion 57. The first and second electrodes 55 and 56 may include contact electrodes 55a and 56a and connecting electrodes 55b and 56b, and partial regions of the contact electrodes 55a and 56a exposed by the insulating portion 57 may be connected to the connecting electrodes 55b and 56b.

The first contact electrode 55a may be provided as a conductive via penetrating through the second conductivity-type semiconductor layer 54 and the active layer 53 to be connected to the first conductivity-type semiconductor layer 52. The second contact electrode 56a may be connected to the second conductivity-type semiconductor layer 54. A plurality of conductive vias may be provided in a single region of the light emitting device.

A conductive ohmic material may be deposited on the first and second conductivity-type semiconductor layers 52 and 54 to form first and second contact electrodes 55a and 56a. The first and second contact electrodes 55a and 56a may contain at least one of Ag, Al, Ni, Cr, Cu, Au, Pd, Pt, Sn, Ti, W, Rh, Ir, Ru, Mg, and Zn, or an alloy containing these materials. In addition, the second contact electrode 56a may serve to reflect light generated in the active layer 53 and emitted downwardly of the light emitting device 50.

The insulating portion 57 may have open regions through which at least portions of the first and second contact electrodes 55a and 56a are exposed, and the first and second connecting electrodes 55b and 56b may be connected to the first and second contact electrodes 55a and 56a, respectively. The insulating portion 57 may be deposited at a thickness, for example, of 0.01 μm to 3 μm at a temperature of 500° C. or lower through a $SiO_2$ and/or SiN CVD process. The first and second electrodes 55 and 56 may be mounted on the light emitting device package in a flip-chip scheme.

The first and second electrodes 55 and 56 may be electrically isolated from each other by the insulating portion 57. Although the insulating portion 57 may be formed of any material as long as the material has electrical insulation properties, the insulating portion 57 may preferably be formed of a material having a low light absorption rate in order to prevent a deterioration in light extraction efficiency. For example, a silicon oxide or a silicon nitride such as $SiO_2$, $SiO_xN_y$, $Si_xN_y$, or the like may be used. If necessary, a light reflecting structure may be formed by dispersing light reflective fillers in a light-transmissive material.

The substrate 51 may have first and second surfaces opposed to each other. An uneven structure may be formed on at least one of the first and second surfaces. The uneven structure formed on one surface of the substrate 51 may be formed by etching a portion of the substrate 51, and may be formed of the same material as that of the substrate 51, or may be configured of a heteromaterial different from that of the substrate 51. For example, an uneven structure may be formed on an interface between the substrate 51 and the first conductivity-type semiconductor layer 52, and thus a path of light emitted from the active layer 53 may be variously formed. Thus, a ratio at which light is absorbed in the interior of a semiconductor layer may be reduced, and a light scattering ratio may be increased to thereby enhance light extraction efficiency. In addition, a buffer layer may be provided between the first substrate 51 and the first conductivity-type semiconductor layer 52.

Figure 12:
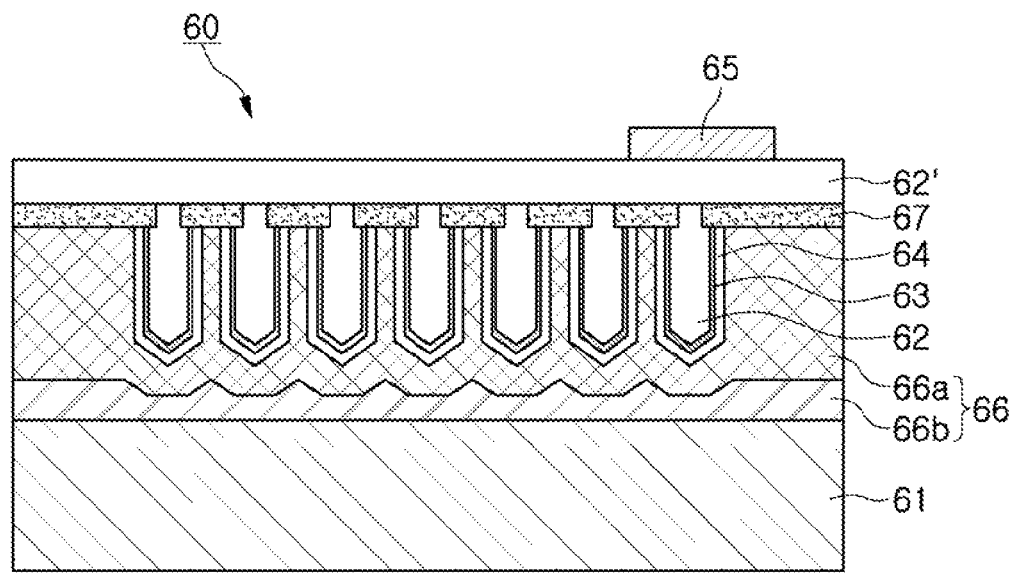

Referring to FIG. 12, a light emitting device 60 according to another exemplary embodiment concept includes a light emitting device 60 having a light emitting nanostructure. The light emitting device 60 may include abase layer 62' containing a first conductivity-type semiconductor material, a mask layer 67 provided on the base layer 62' and providing a plurality of openings, and nanocores 62 formed in the openings of the mask layer 67. On the nanocores 62, active layers 63 and second conductivity-type semiconductor layers 64 may be provided. The nanocores 62, the active layers 63, and the second conductivity-type semiconductor layers 64 may provide the light emitting nanostructure.

A second contact electrode 66a may be prepared on the second conductivity-type semiconductor layers 64, and a second connecting electrode 66b may be provided on one surface of the second contact electrode 66a. The second contact electrode 66a and the second connecting electrode 66b may be provided as a second electrode 66. A support substrate 61 may be attached to one surface of the second electrode 66, and may be a conductive substrate or an insulating substrate. In the case in which the support substrate 61 has conductivity, the support substrate 61 may be directly mounted on a circuit board of a light emitting device package. A first electrode 65 may be provided on the base layer 62' containing a first conductivity-type semiconductor material. The first electrode 65 may be connected to a circuit pattern included in the circuit board of the light emitting device package by a wire, or the like.

FIG. 13A and FIG. 13B are views schematically illustrating white light source modules applicable to a lighting apparatus according to an exemplary embodiment. FIG. 14 is a CIE 1931 color space chromaticity diagram provided for describing operations of the white light source modules illustrated in FIG. 13A and FIG. 13B.

Each of the white light source modules illustrated in FIG. 13A and FIG. 13B may include a plurality of light emitting device packages. The plurality of light emitting device packages mounted in a single white light source module may be configured of the same kinds of packages generating light having the same wavelength, but in some embodiments, may also be configured of different types of packages generating light having different wavelengths.

Referring to FIG. 13A, the white light source module may be configured by combining a white light emitting device package '40' having a color temperature of 4000K, a white light emitting device package '30' having a color temperature of 3000K, and a red light emitting device package R. The white light source module may allow a color temperature thereof to be adjusted within a range of 3000K to 4000K, and may provide white light having a color rendering index Ra of 85 to 100.

In another embodiment, the white light source module may be configured of only white light emitting device packages, and, in this case, some of the packages may generate white light having different color temperatures. For example, as illustrated in FIG. 13B, a white light emitting device package '27' having a color temperature of 2700K and a white light emitting device package '50' having a color temperature of 5000K may be combined to provide white light in which a color temperature thereof may be adjusted within a range of 2700K to 5000K, and a color rendering index Ra thereof is 85 to 100. Here, the number of light emitting device packages having respective color temperatures may mainly be varied depending on a basic, predetermined value of a color temperature. In the case of a lighting apparatus in which the basic, predetermined value of the color temperature is in the vicinity of 4000K, for example, the number of light emitting device packages corresponding to the color temperature of 4000K may be greater than that of light emitting device packages having a color temperature of 3000K or red light emitting device packages.

In this manner, different types of light emitting device packages may be configured to include at least one of a violet, blue, green, red or infrared light emitting device, and a light emitting device generating white light formed by combining yellow, green, red or orange phosphors with a blue light emitting device, whereby a color temperature and a color rendering index of white light may be adjusted. The white light source module may be employed as a light source in lighting apparatuses having various forms.

A single light emitting device package may determine light of desired color depending on a wavelength of an LED chip, a light emitting device, and kinds and a mixing ratio of phosphors, and in the case of white light, may adjust a color temperature and a color rendering index thereof.

For example, when the LED chip emits blue light, a light emitting device package including at least one of a yellow phosphor, a green phosphor, and a red phosphor may emit white light having various color temperatures by adjusting a mixing ratio of the phosphors. Unlike this, a light emitting device package applying a green or red phosphor to a blue LED chip may emit green or red light. In this manner, a color temperature and a color rendering index (CRI) of white light may be adjusted by combining a light emitting device package emitting white light with a package emitting green or red light. In addition, the light emitting device package may be configured to include at least one of light emitting devices emitting violet, blue, green, red, or infrared light.

In this case, a lighting apparatus may adjust a color rendering index (CRI) from a natrium (Na) to a solar light level, and may generate various types of white light with color temperatures ranging from 2000K to 20,000K. Also, if necessary, the lighting apparatus may generate violet, blue, green, red, or orange visible light, or infrared light, to adjust the color of light according to a surrounding atmosphere and a user's mood. Also, the lighting apparatus may generate a specific wavelength of light for accelerating the growth of plants.

White light formed by combining yellow, green, and red phosphors with a blue light emitting device and/or combining green and red light emitting devices may have two or more peak wavelengths, and coordinates (x, y) thereof in the CIE 1931 color space chromaticity diagram of FIG. 14 may be positioned on a line segment connecting (0.4476, 0.4074), (0.3484, 0.3516), (0.3101, 0.3162), (0.3128, 0.3292), and (0.3333, 0.3333). Alternatively, coordinates (x, y) thereof in the CIE 1931 color space chromaticity diagram may be positioned in a region surrounded by the line segment and blackbody radiation spectrum. The color temperature of white light may range from 1500K to 20000K. In FIG. 14, white light in the vicinity of point E (0.3333, 0.3333), disposed below the blackbody radiation spectrum, may be in a state in which a level of yellow light is relatively low, and may be used as a light source in a region exhibiting a brighter or fresher feeling. Therefore, lighting products using white light in the vicinity of point E (0.3333, 0.3333), disposed below the blackbody radiation spectrum, may be highly effective as lighting apparatuses for retail spaces selling groceries, clothing, and the like.

Figure 15:
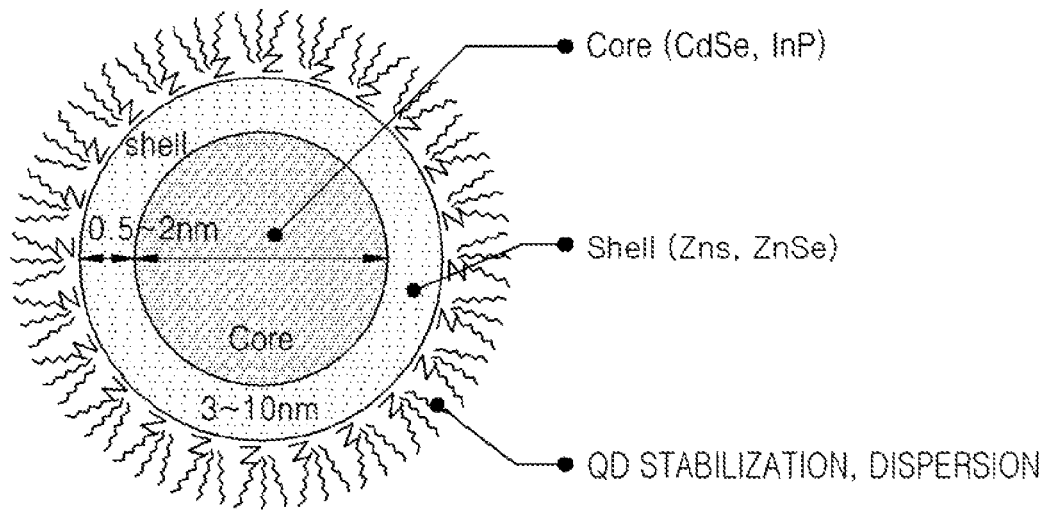
FIG. 15 is a view illustrating a wavelength conversion material applicable to a light source of a lighting apparatus according to certain exemplary embodiments of the present inventive concept.

FIG. 15 is a view illustrating a wavelength conversion material applicable to a light source of a lighting apparatus according to an exemplary embodiment.

Various materials such as phosphors and/or quantum dots may be used as the wavelength conversion material, a material for converting a wavelength of light emitted from the light emitting device.

In an exemplary embodiment, the phosphors applied to the wavelength conversion material may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba, Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $$Ln_{4-x}(Eu_zM_{1-z})_xSi_{12-y}Al_yO_{3+x+y}N_{18-x-y} (0.5 \leq x \leq 3, 0 < z < 0.3, 0 < y \leq 4) \quad \text{Equation (1)}$$

In Equation (1), Ln may be at least one type of element selected from the group consisting of Group IIIa elements and rare earth elements, and M may be at least one type of element selected from the group consisting of calcium (Ca), barium (Ba), strontium (Sr), and magnesium (Mg).

Fluorides: KSF-based red $K_2SiF_6$:$Mn_4^+$, $K_2TiF_6$:$Mn_4^+$, $NaYF_4$:$Mn_4^+$, $NaGdF_4$:$Mn_4^+$ (for example, a composition ratio of Mn may be $0 < z \leq 0.17$).

Phosphor compositions should basically conform with stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La) based elements such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone or with a co-activator for modifying characteristics of phosphors.

In particular, in order to enhance reliability at high temperatures and high humidity, a fluoride-based red phosphor may be coated with a fluoride not containing manganese (Mn) or with organic materials thereon. The organic materials may be coated on the fluoride-based red phosphor coated with a fluoride not containing manganese (Mn). Unlike other phosphors, the fluoride-based red phosphor may realize a narrow full width at half maximum (FWHM) equal to or less than 40 nm, and thus, it may be utilized in high resolution TVs such as UHD TVs.

Table 1 below illustrates types of phosphors in application fields of light emitting device packages using a blue LED chip having a wavelength of 440 nm to 460 nm, or a UV LED chip having a wavelength of 380 nm to 440 nm.

TABLE 1

| USE | Phosphor |
| --- | --- |
| LED TV BLU | β-SiAlON:Eu2+ |
| | (Ca, Sr)AlSiN$_3$:Eu2+ |
| | La$_3$Si$_6$N$_{11}$:Ce3+ |
| | K$_2$SiF$_6$:Mn4+ |
| | SrLiAl3N4:Eu |
| | Ln$_{4-x}$(Eu$_z$M$_{1-z}$)$_x$Si$_{12-y}$Al$_y$O$_{3+x+y}$N$_{18-x-y}$ |
| | (0.5 ≤ x ≤ 3, 0 < z ≤ 0.3, 0 < y ≤ 4) |
| | K2TiF6:Mn4+ |
| | NaYF4:Mn4+ |
| | NaGdF4:Mn4+ |
| Lighting device | Lu$_3$Al$_5$O$_{12}$:Ce3+ |
| | Ca-α-SiAlON:Eu2+ |
| | La$_3$Si$_6$N$_{11}$:Ce3+ |
| | (Ca, Sr)AlSiN$_3$:Eu2+ |
| | Y$_3$Al$_5$O$_{12}$:Ce3+ |
| | K$_2$SiF$_6$:Mn4+ |
| | SrLiAl3N4:Eu |
| | Ln$_{4-x}$(Eu$_z$M$_{1-z}$)$_x$Si$_{12-y}$Al$_y$O$_{3+x+y}$N$_{18-x-y}$ |
| | (0.5 ≤ x ≤ 3, 0 < z ≤ 0.3, 0 < y ≤ 4) |
| | K2TiF6:Mn4+ |
| | NaYF4:Mn4+ |
| | NaGdF4:Mn4+ |
| Side View (Mobile, Note PC) | Lu$_3$Al$_5$O$_{12}$:Ce3+ |
| | Ca-α-SiAlON:Eu2+ |
| | La$_3$Si$_6$N$_{11}$:Ce3+ |
| | (Ca, Sr)AlSiN$_3$:Eu2+ |
| | Y$_3$Al$_5$O$_{12}$:Ce3+ |
| | (Sr, Ba, Ca, Mg)2SiO4:Eu2+ |
| | K$_2$SiF$_6$:Mn4+ |
| | SrLiAl3N4:Eu |
| | Ln$_{4-x}$(Eu$_z$M$_{1-z}$)$_x$Si$_{12-y}$Al$_y$O$_{3+x+y}$N$_{18-x-y}$ |
| | (0.5 ≤ x ≤ 3, 0 < z ≤ 0.3, 0 < y ≤ 4) |
| | K2TiF6:Mn4+ |
| | NaYF4:Mn4+ |
| | NaGdF4:Mn4+ |
| Electronic device (Head Lamp, etc.) | Lu$_3$Al$_5$O$_{12}$:Ce3+ |
| | Ca-α-SiAlON:Eu2+ |
| | La$_3$Si$_6$N$_{11}$:Ce3+ |
| | (Ca, Sr)AlSiN$_3$:Eu2+ |
| | Y$_3$Al$_5$O$_{12}$:Ce3+ |
| | K$_2$SiF$_6$:Mn4+ |
| | SrLiAl3N4:Eu |
| | Ln$_{4-x}$(Eu$_z$M$_{1-z}$)$_x$Si$_{12-y}$Al$_y$O$_{3+x+y}$N$_{18-x-y}$ |
| | (0.5 ≤ x ≤ 3, 0 < z ≤ 0.3, 0 < y ≤ 4) |
| | K2TiF6:Mn4+ |
| | NaYF4:Mn4+ |
| | NaGdF4:Mn4+ |

The wavelength conversion material may include quantum dots (QD) provided to be used in place of phosphors or to be mixed with phosphors.

FIG. 15 is a view illustrating a cross-sectional structure of a quantum dot. The quantum dot may have a core-shell structure including Group II-VI or Group III-V compound semiconductors. For example, the quantum dot may have a core such as CdSe or InP, or a shell such as ZnS or ZnSe. Also, the quantum dot may include a ligand to stabilize the core and shell. For example, the core may have a diameter ranging from 1 nm to 30 nm, and preferably, 3 nm to 10 nm in an exemplary embodiment. The shell may have a thickness ranging from 0.1 nm to 20 nm, and preferably, 0.5 nm to 2 nm in an exemplary embodiment.

The quantum dots may realize various colors according to sizes, and, in particular, when the quantum dot is used as a phosphor substitute, it may be used as a red or green phosphor. The use of a quantum dot may realize a narrow FWHM (e.g., about 35 nm).

The wavelength conversion material may be provided in the form of being contained in an encapsulator, or alternatively, the wavelength conversion material may be manufactured as a film in advance and attached to a surface of an optical device such as an LED chip or a light guide plate. In the case of using the wavelength conversion material manufactured as a film in advance, a wavelength conversion material having a uniform thickness may be easily implemented.

FIG. 16 through FIG. 24 are views illustrating backlight units including the LED driving apparatus according to certain exemplary embodiments.

Figure 16:
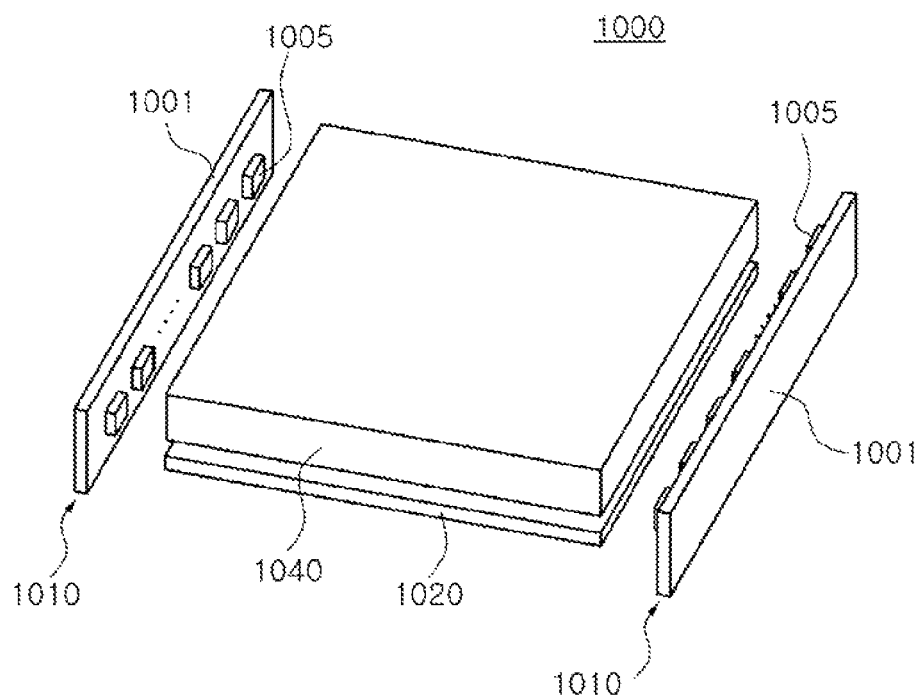
FIG. 16 through FIG. 24 are views illustrating backlight units including the LED driving apparatus according to exemplary embodiments of the present inventive concept.

Referring to FIG. 16, a backlight unit 1000 may include a light guide plate 1040 and light source modules 1010 provided on both sides of the light guide plate 1040. Also, the backlight unit 1000 may further include a reflective plate 1020 disposed below the light guide plate 1040. The backlight unit 1000 according to the exemplary embodiment of FIG. 16 may be an edge type backlight unit.

According to an exemplary embodiment, the light source module 1010 may be provided only on one side of the light guide plate 1040, or may further be provided on the other side thereof. The light source module 1010 may include a printed circuit board (PCB) 1001 and a plurality of light sources 1005 mounted on an upper surface of the PCB 1001. The plurality of light sources 1005 may be driven by the LED driving apparatus 110, 210, or 310 described with reference to FIG. 1 through FIG. 6.

Figure 17:
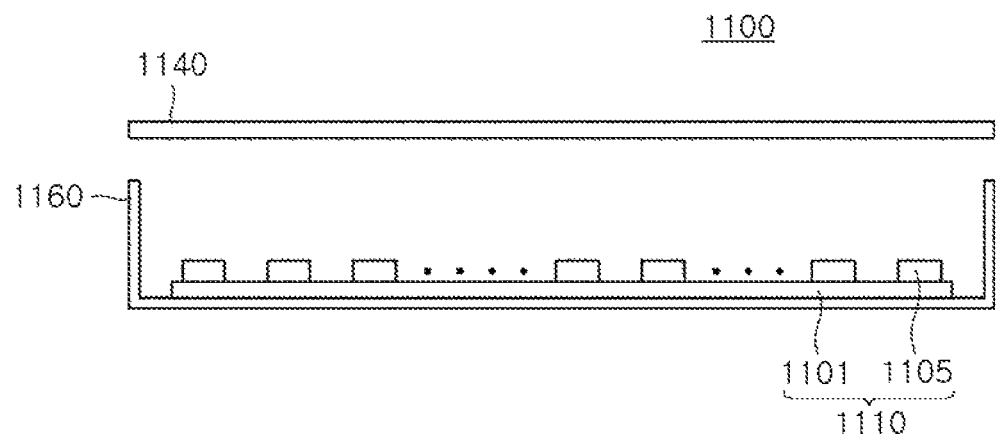

FIG. 17 is a view illustrating an embodiment of a direct type backlight unit.

Referring to FIG. 17, a backlight unit 1100 may include a light diffuser plate 1140 and a light source module 1110 arranged below the light diffuser plate 1140. Also, the backlight unit 1100 may further include a bottom case 1160 disposed below the light diffuser plate 1140 and accommodating the light source module 1110. The backlight unit 1100 according to the exemplary embodiment may be a direct type backlight unit.

The light source module 1110 may include a printed circuit board (PCB) 1101 and a plurality of light sources 1105 mounted on an upper surface of the PCB 1101. The plurality of light sources 1105 may be driven by the LED driving apparatus 110, 210, or 310 described with reference to FIG. 1 through FIG. 6.

Figure 18:
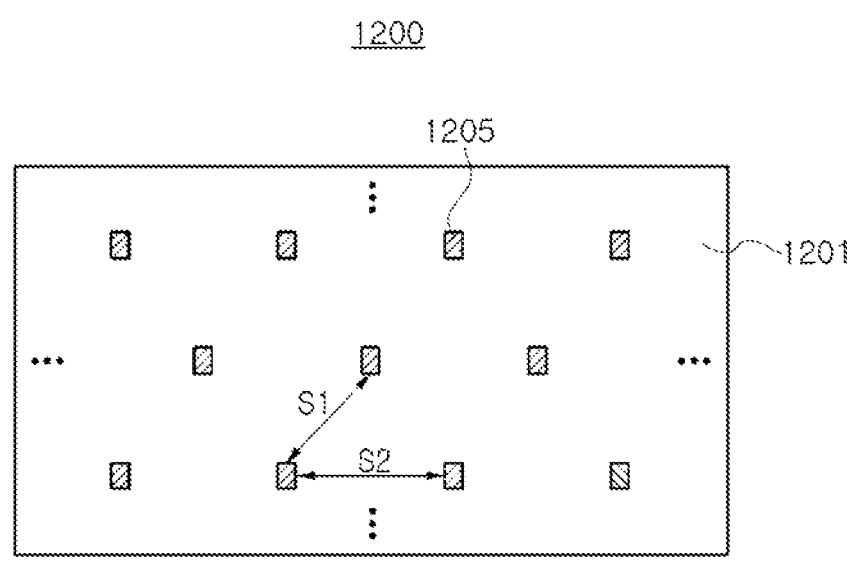

FIG. 18 is a view illustrating an example of disposition of light sources in the direct type backlight unit.

A direct type backlight unit 1200 according to the exemplary embodiment may include a plurality of light sources 1205 arranged on a board 1201.

The arrangement structure of the light sources 1205 is a matrix structure in which the light sources 1205 are arranged in rows and columns, and here, the rows and columns have a zigzag form. This is a structure in which a second matrix having the same form as that of a first matrix is disposed within the first matrix in which the plurality of light sources 1205 are arranged in rows and columns in straight lines, which may be understood as that each light source 1205 of the second matrix is positioned within a quadrangle formed by four adjacent light sources 1205 included in the first matrix.

However, in the direct type backlight unit 1200 according to the exemplary embodiment illustrated in FIG. 18, in order to enhance uniformity of brightness and light efficiency, if necessary, the first and second matrices may have different disposition structures and intervals. Also, in addition to the method of disposing the plurality of light sources, distances S1 and S2 between adjacent light sources may be optimized to secure uniformity of brightness.

In this manner, since the rows and columns of the light sources 1205 are disposed in a zigzag manner, rather than being disposed in straight lines, the number of light sources 1205 may be reduced by about 15% to 25% in comparison with a backlight unit having the same light emitting area.

Figure 19:
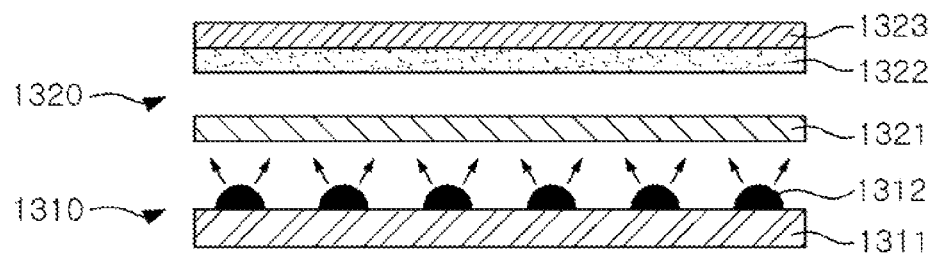

FIG. 19 is a view illustrating another embodiment of a direct type backlight unit.

Referring to FIG. 19, a backlight unit 1300 according to an exemplary embodiment may include an optical sheet 1320 and a light source module 1310 arranged below the optical sheet 1320.

The optical sheet 1320 may include a diffusion sheet 1321, a light collecting sheet 1322, a protective sheet 1323, and the like. A configuration and an arrangement order of the sheets 1321 to 1323 included in the optical sheet 1320 are not limited to those illustrated in FIG. 19, and may be variously modified.

The light source module 1310 may include a circuit board 1311 and a plurality of light source units 1312 mounted on the circuit board 1311. The plurality of light source units 1312 may be driven by the LED driving apparatus 110, 210, or 310 described with reference to FIG. 1 through FIG. 6, and optical elements adjusting a path of light emitted from the light source may be disposed on the light sources.

The optical elements may adjust a beam angle of light through refraction, and in particular, a wide beam angle lens diffusing light from the light source units 1312 to a wide region may be mainly used as the optical elements. Since the light source units 1312 with the optical elements attached thereto may have wider light distribution (and thus, when the light source module is used in a backlight, a planar lighting, and the like), the number of light sources 1312 per unit area may be reduced.

Figure 20:
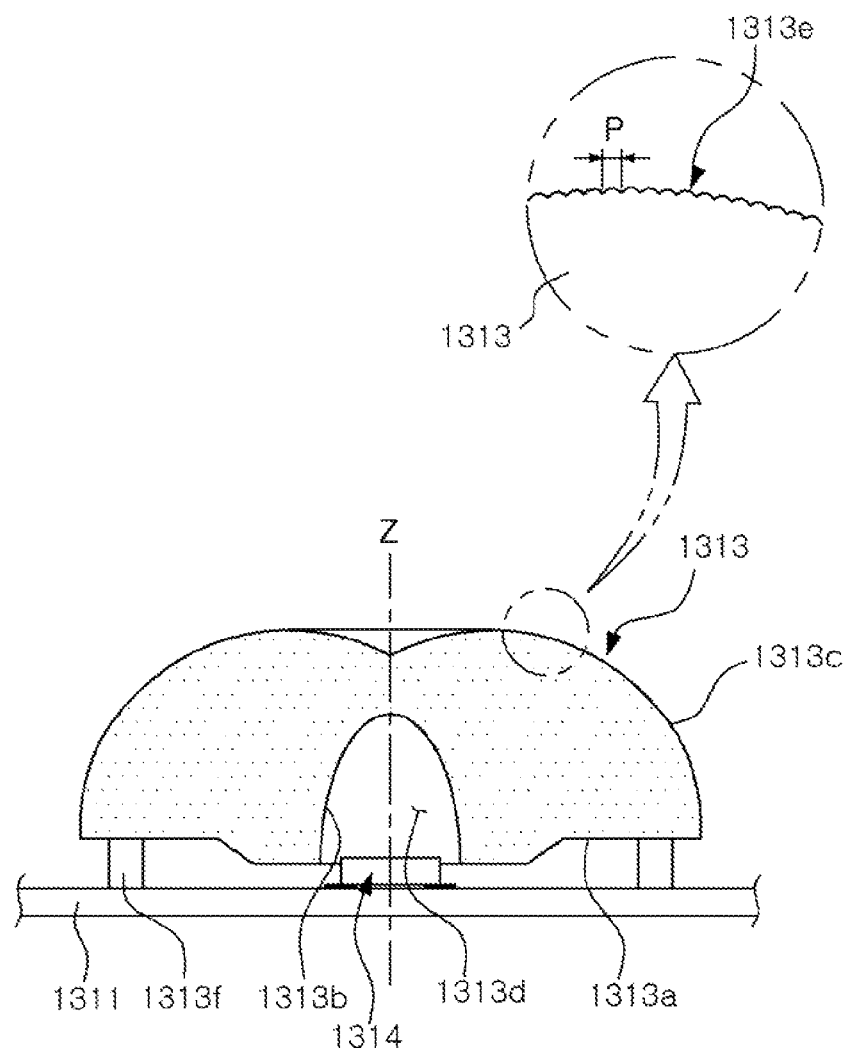

FIG. 20 is an exploded view illustrating the light source unit 1312 illustrated in FIG. 19.

Referring to FIG. 20, each of the plurality of light source units 1312 may include a light source 1314 including a light emitting device package 100, 200, 300, or 400 and an optical element 1313. The optical element 1313 may include a bottom surface 1313a disposed on the light source 1314, an incident surface 1313b to which light from the light source 1314 is incident, and an output surface 1313c from which light is emitted outwardly.

The bottom surface 1313a may have a recess portion 1313d formed in the center through which an optical axis Z of the light source 1314 passes, and may be depressed in a direction toward the output surface 1313c. A surface of the recess portion 1313d may be defined as the incident surface 1313b to which light from the light source 1314 is incident. That is, the incident surface 1313b may form the surface of the recess portion 1313d.

A central region of the bottom surface 1313a connected to the incident surface 1313b partially protrudes to the light source 1314, thereby forming an overall non-flat structure. Unlike a general structure in which the entirety of the bottom surface 1313a is flat, the bottom surface 1313a has a structure in which portions thereof protrude along the circumference of the recess portion 1313d. A plurality of support portions 1313f may be provided on the bottom surface 1313a in order to fixedly support the optical element 1313 when the optical element 1313 is mounted on the circuit board 1311.

The output surface 1313c protrudes to have a dome shape in an upward direction (a light output direction) from the edge connected to the bottom surface 1313a, and the center of the output surface 1313c through which the optical axis Z passes is depressed to be concave toward the recess portion 1313d, having a point of inflection.

A plurality of prominences and depressions 1313e may be periodically arranged in a direction from the optical axis Z toward the edge. The horizontal cross-section of each of the plurality of prominences and depressions 1313e may be an annular shape, and may form concentric circles centered on the optical axis Z. The plurality of prominences and depressions 1313e may be periodically arranged to spread out radially along the output surface 1313c from the optical axis Z.

The plurality of prominences and depressions 1313e may be spaced apart by a predetermined period (pitch) P to form patterns. In this case, the period P between the plurality of prominences and depressions 1313e may range, for example, from 0.01 mm to 0.04 mm. The plurality of prominences and depressions 1313e may offset a performance gap of optical elements arising from a microscopic machining error generated in a process of fabricating the optical elements, thereby enhancing uniformity of light distribution.

Figure 21:
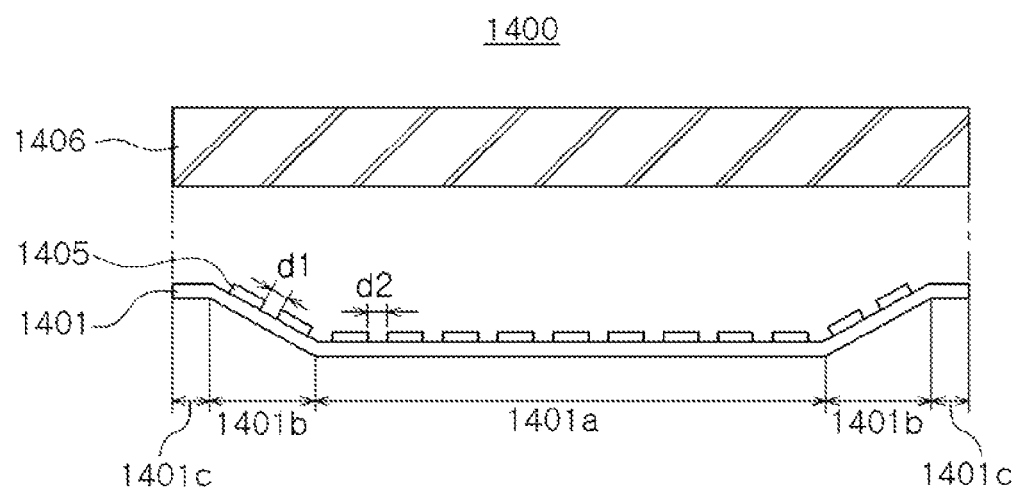

FIG. 21 is a view illustrating another embodiment of a direct type backlight unit.

Referring to FIG. 21, a backlight unit 1400 includes a light source 1405 mounted on a circuit board 1401 and at least one optical sheet 1406 disposed thereabove. The light source 1405 may be driven by the LED driving apparatus 110, 210, or 310 described with reference to FIG. 1 through FIG. 6.

The circuit board 1401 employed in the exemplary embodiment may have a first planar portion 1401a corresponding to a main region, a sloped portion 1401b disposed around the first planar portion 1401a and bent in at least a portion thereto, and a second planar portion 1401c disposed on the edge of the circuit board 1501, namely, an outer side of the sloped portion 1401b. The light sources 1405 are arranged at a first interval d1 on the first planar portion 1401a, and one or more light sources 1405 may be arranged at a second interval d2 on the sloped portion 1401b. The first interval d1 may be equal to the second interval d2. A width of the sloped portion 1401b (or a length in the cross-section) may be smaller than that of the first planar portion 1401a and may be larger than a width of the second planar portion 1401c. Also, if necessary, at least one light source 1405 may be arranged on the second planar portion 1401c.

A slope of the sloped portion 1401b may be appropriately adjusted within a range from 0 to 90 degrees with respect to the first planar portion 1401a, and with this structure, the circuit board 1401 may maintain uniform brightness even in the vicinity of the edge of the optical sheet 1406.

Figure 22:
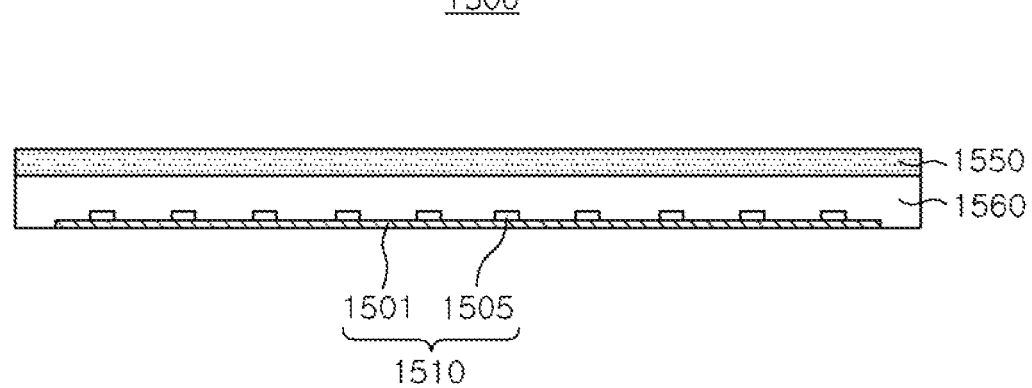
Figure 23:
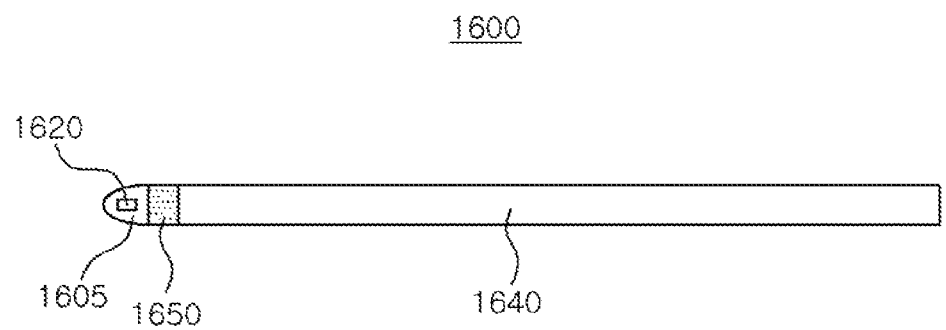
Figure 24:
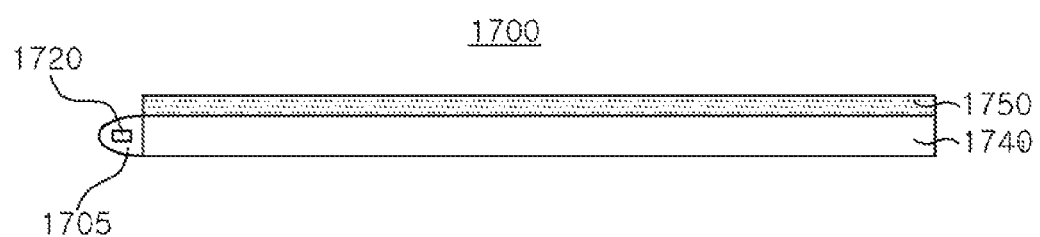

In backlight units 1500, 1600, and 1700 in FIG. 22 through FIG. 24, wavelength conversion units 1550, 1650, and 1750 are disposed outside of light sources 1505, 1605, and 1705, rather than being disposed in the light sources 1505, 1605, and 1705, to convert light, respectively.

Referring to FIG. 22, the backlight unit 1500 is a direct type backlight unit including the wavelength conversion unit 1550, a light source module 1510 arranged below the wavelength conversion unit 1550, and a bottom case 1560 accommodating the light source module 1510. Also, the light source module 1510 may include a PCB 1501 and a plurality of light sources 1505 mounted on an upper surface of the PCB 1501.

In the backlight unit 1500 according to the exemplary embodiment of FIG. 22, the wavelength conversion unit 1550 may be disposed above the bottom case 1560. Thus, at least a partial amount of light emitted from the light source module 1510 may be wavelength-converted by the wavelength conversion unit 1550. The wavelength conversion unit 1550 may be manufactured as a separate film and applied to the backlight unit 1500 in a film form, or alternatively, the wavelength conversion unit 1550 may be integrally combined with a light diffuser (not shown) so as to be provided.

Referring to FIGS. 23 and 24, backlight units 1600 and 1700 are edge type backlight units respectively including wavelength conversion units 1650 and 1750, light guide plates 1640 and 1740, and reflective units 1620 and 1720 and light sources 1605 and 1705 disposed on one side of the light guide plates 1640 and 1740.

Light emitted from the light sources 1605 and 1705 may be guided to the interior of the light guide plates 1640 and 1740 by the reflective units 1620 and 1720, respectively. In the backlight unit 1600 of FIG. 23, the wavelength conversion unit 1650 may be disposed between the light guide plate 1640 and the light source 1605. In the backlight unit 1700 of FIG. 24, the wavelength conversion unit 1750 may be disposed on a light emitting surface of the light guide plate 1740.

In FIG. 22 through FIG. 24, the wavelength conversion units 1550, 1650, and 1750 may include a general phosphor. In particular, in the case of using a quantum dot phosphor, the structures of wavelength conversion units 1550, 1650, and 1750 illustrated in FIG. 22 through FIG. 24 may be utilized in the backlight units 1500, 1600, and 1700 in order to compensate for the vulnerability of the quantum dot phosphor to heat or moisture from a light source.

Figure 25:
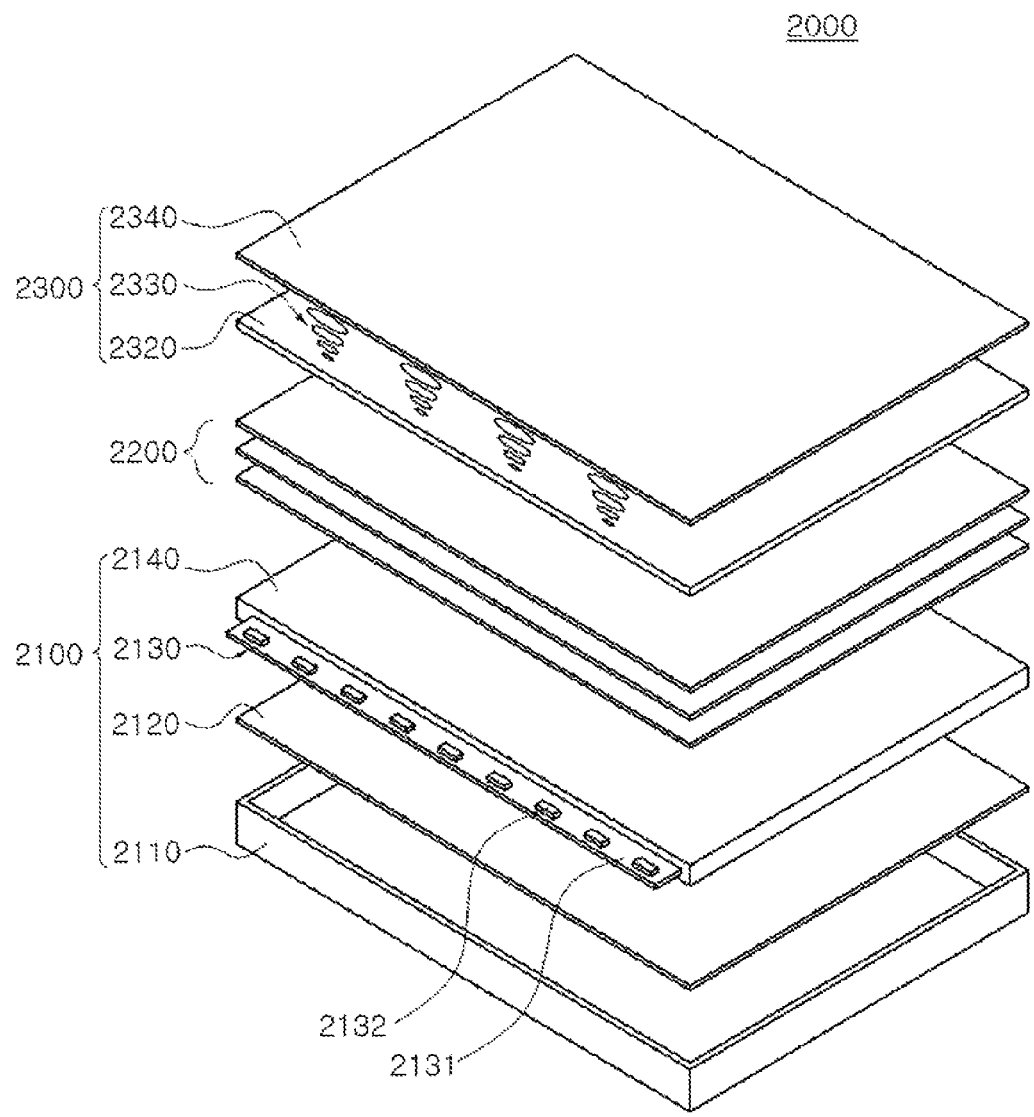
FIG. 25 is a schematic, exploded perspective view of a display apparatus including the LED driving apparatus according to certain exemplary embodiments of the present inventive concept.

FIG. 25 is a schematic, exploded perspective view of a display apparatus including the LED driving apparatus according to an exemplary embodiment of the present inventive concept.

Referring to FIG. 25, a display apparatus 2000 may include a backlight unit 2100, an optical sheet 2200, and an image display panel 2300 such as a liquid crystal panel.

The backlight unit 2100 may include a bottom case 2110, a reflective plate 2120, a light guide plate 2140, and a light source module 2130 provided on at least one side of the light guide plate 2140. The light source module 2130 may include a PCB 2131 and light sources 2132. In particular, the light sources 2132 may be driven by the LED driving apparatus 110, 210, or 310 described with reference to FIG. 1 through FIG. 6.

The optical sheet 2200 may be disposed between the light guide plate 2140 and the image display panel 2300 and may include various types of sheets such as a diffusion sheet, a prism sheet, and a protective sheet.

The image display panel 2300 may display an image using light output from the optical sheet 2200. The image display panel 2300 may include an array substrate 2320, a liquid crystal layer 2330, and a color filter substrate 2340. The array substrate 2320 may include pixel electrodes disposed in a matrix form, thin film transistors (TFTs) applying a driving voltage to the pixel electrodes, and signal lines operating the TFTs. The color filter substrate 2340 may include a transparent substrate, a color filter, and a common electrode. The color filter may include filters allowing light having a particular wavelength, included in white light emitted from the backlight unit 2100, to selectively pass therethrough. Liquid crystals contained in the liquid crystal layer 2330 are rearranged by an electric field applied between the pixel electrodes and the common electrode, and thereby light transmittance is adjusted. The light with transmittance thereof adjusted may pass through the color filter of the color filter substrate 2340, thus displaying an image. The image display panel 2300 may further include a driving circuit unit processing an image signal, or the like.

The display apparatus 2000 according to certain exemplary embodiments uses the light sources 2132 emitting blue light, green light, and red light having a relatively small FWHM. Thus, emitted light, after passing through the color filter substrate 2340, may implement blue, green, and red having a high level of color purity.

FIG. 26 through FIG. 29 are views each illustrating a lighting apparatus according to other exemplary embodiments of the present inventive concept.

Figure 26:
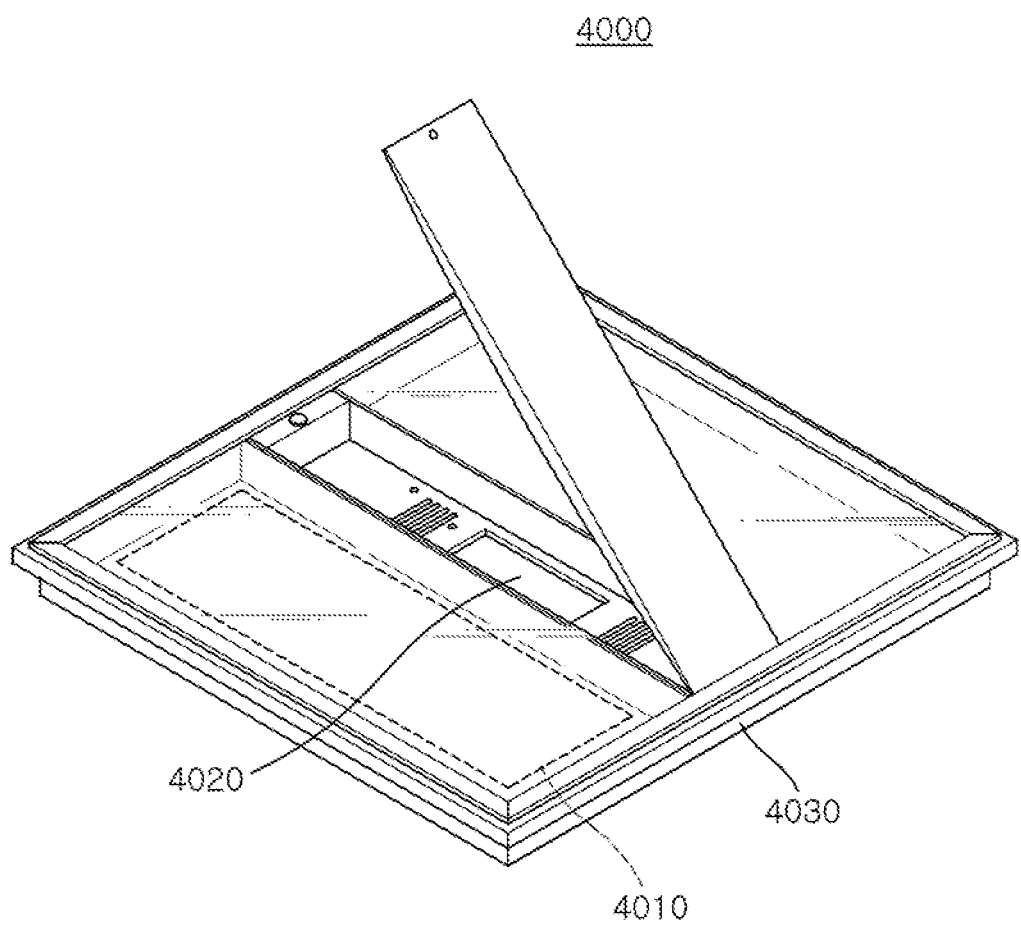
FIG. 26 through FIG. 29 are views each illustrating a lighting apparatus according to certain exemplary embodiments of the present inventive concept.

Referring to FIG. 26, a planar type lighting apparatus 4000 may include a light source module 4010, a power supply device 4020, and a housing 4030. According to an exemplary embodiment of the present inventive concept, the light source module 4010 may include a light emitting device array as a light source, and the power supply device 4020 may include a light emitting device driving unit.

The light source module 4010 may include a light emitting device array and may be formed to have an overall planar shape. According to an exemplary embodiment of the present inventive concept, the light emitting device array may include a light emitting device and a controller storing driving information of the light emitting device. The light emitting device array may include a plurality of light emitting device packages connected to each other in series or in parallel.

The power supply device 4020 may be configured to supply power to the light source module 4010, and may include the LED driving apparatuses 110, 210, and 310 described with reference to FIG. 1 through FIG. 6. The housing 4030 may have an accommodation space accommodating the light source module 4010 and the power supply device 4020 therein and have a hexahedral shape with one side thereof open, but the shape of the housing 4030 is not limited thereto. The light source module 4010 may be disposed to emit light to the open side of the housing 4030.

Figure 27:
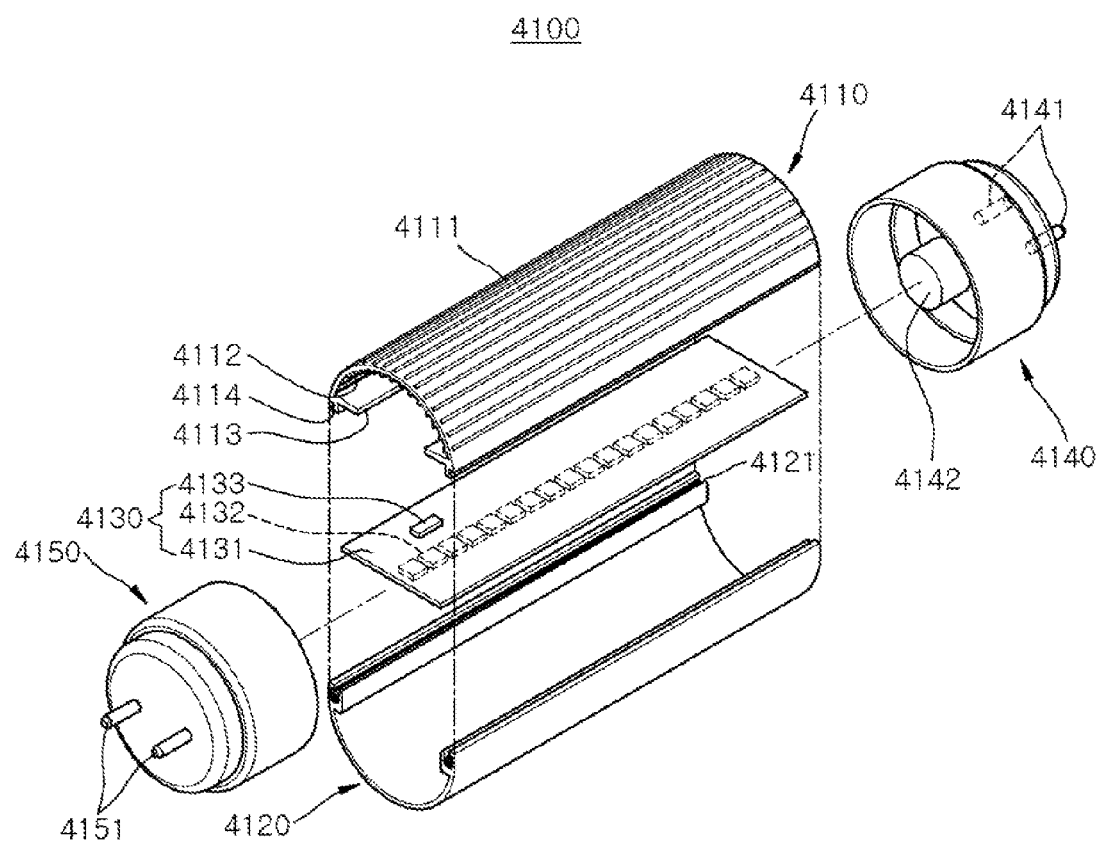

FIG. 27 is an exploded perspective view schematically illustrating a bar type lamp as a lighting apparatus according to an exemplary embodiment of the present inventive concept.

In detail, a lighting apparatus 4100 includes a heat sink 4110, a cover 4120, a light source module 4130, a first socket 4140, and a second socket 4150. A plurality of heat sink fins 4111 and 4112 may be formed in a concavo-convex pattern on an internal and/or external surface of the heat sink 4110, and the heat sink fins 4111 and 4112 may be designed to have various shapes and intervals (spaces) therebetween. A support 4113 having a protruded shape may be formed on an inner side of the heat sink 4110. The light source module 4130 may be fixed to the support 4113. Stoppage protrusions 4114 may be formed on both ends of the heat sink 4110.

The stoppage recesses 4121 may be formed in the cover 4120, and the stoppage protrusions 4114 of the heat sink 4110 may be coupled to the stoppage recesses 4121. The positions of the stoppage recesses 4121 and the stoppage protrusions 4114 may be interchanged.

The light source module 4130 may include a light emitting device array. The light source module 4130 may include a PCB 4131, a light source 4132, and a controller 4133. As described above, the controller 4133 may store driving information of the light source 4132. Circuit wirings are formed on the PCB 4131 to operate the light source 4132. Also, components for operating the light source 4132 may be provided. For example, the LED driving apparatuses 110, 210, and 310 described with reference to FIG. 1 through FIG. 6 may be implemented in the PCB 4131, and the controller 4133 may perform functions of the controller IC 112, 212, and 312 described with reference to FIG. 1 through FIG. 6.

The first and second sockets 4140 and 4150, a pair of sockets, are respectively coupled to opposing ends of the cylindrical cover unit including the heat sink 4110 and the cover 4120. For example, the first socket 4140 may include electrode terminals 4141 and a power source device 4142, and dummy terminals 4151 may be disposed on the second socket 4150. Also, an optical sensor and/or a communications module may be installed in either the first socket 4140 or the second socket 4150. For example, the optical sensor and/or the communications module may be installed in the second socket 4150 in which the dummy terminals 4151 are disposed. In another example, the optical sensor and/or the communications module may be installed in the first socket 4140 in which the electrode terminals 4141 are disposed.

Figure 28:
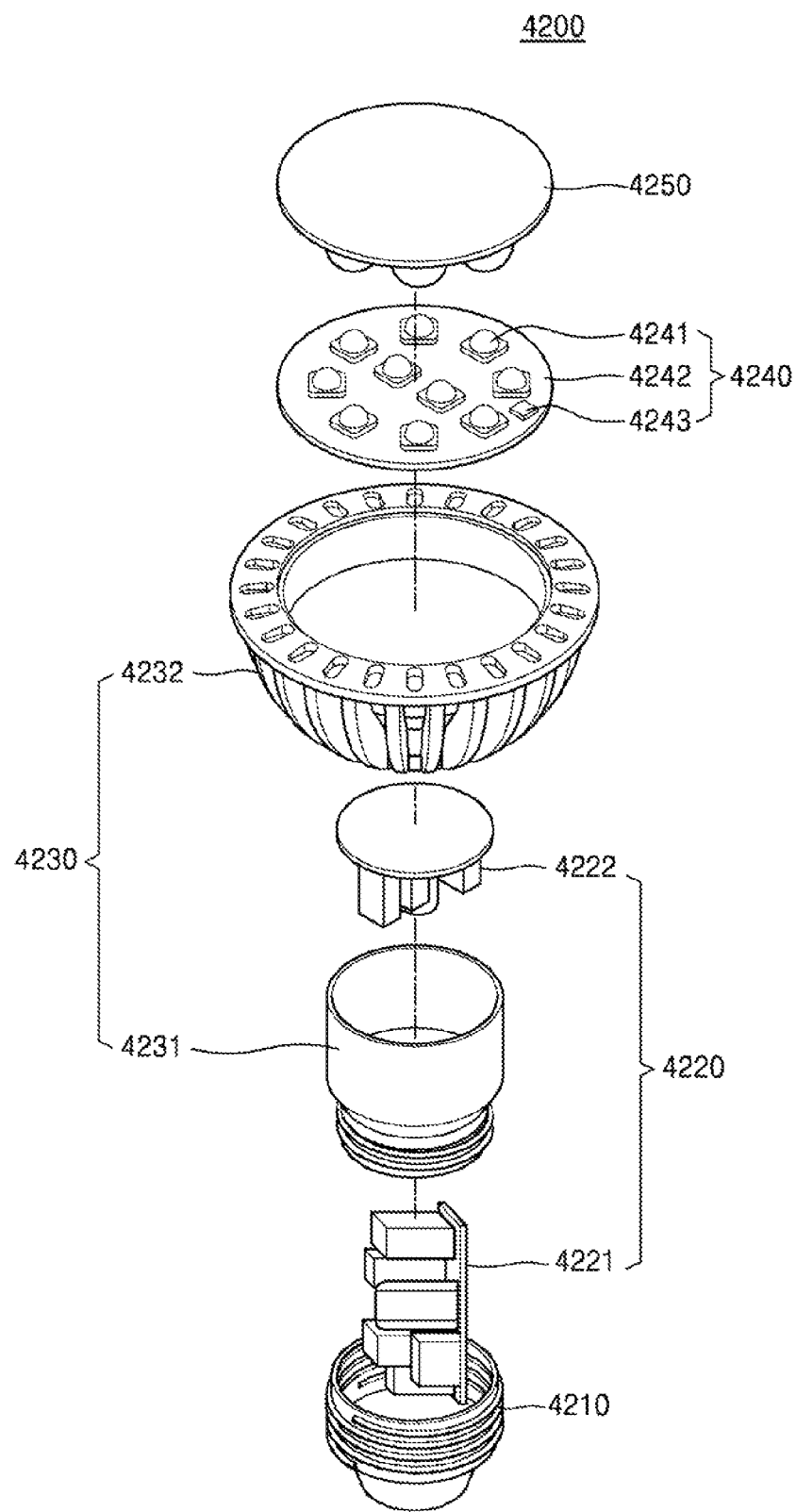

FIG. 28 is an exploded perspective view schematically illustrating a bulb type lamp as a lighting apparatus according to an exemplary embodiment of the present inventive concept.

In detail, a lighting apparatus 4200 may include a socket 4210, a power source unit 4220, a heat sink 4230, a light source module 4240, and an optical unit 4250. According to an exemplary embodiment of the present inventive concept, the light source module 4240 may include a light emitting device array, and the power source unit 4220 may be driven by the LED driving apparatuses 110, 210, and 310 described with reference to FIG. 1 through FIG. 6.

The socket 4210 may be configured to be replaced with an existing lighting apparatus. Power supplied to the lighting apparatus 4200 may be applied through the socket 4210. As illustrated, the power source unit 4220 may include a first power source unit 4221 and a second power source unit 4222. The first power source unit 4221 and the second power source unit 4222 may be assembled to form the power source unit 4220. The heat sink 4230 may include an internal heat sink 4231 and an external heat sink 4232. The internal heat sink 4231 may be directly connected to the light source module 4240 and/or the power source unit 4220 to transmit heat to the external heat sink 4232. The optical unit 4250 may include an internal optical unit (not shown) and an external optical unit (not shown) and may be configured to evenly distribute light emitted from the light source module 4240.

The light source module 4240 may emit light to the optical unit 4250 upon receiving power from the power source unit 4220. The light source module 4240 may include one or more light emitting devices 4241, a circuit board 4242, and a controller 4243. The controller 4243 may store driving information of the light emitting devices 4241.

Figure 29:
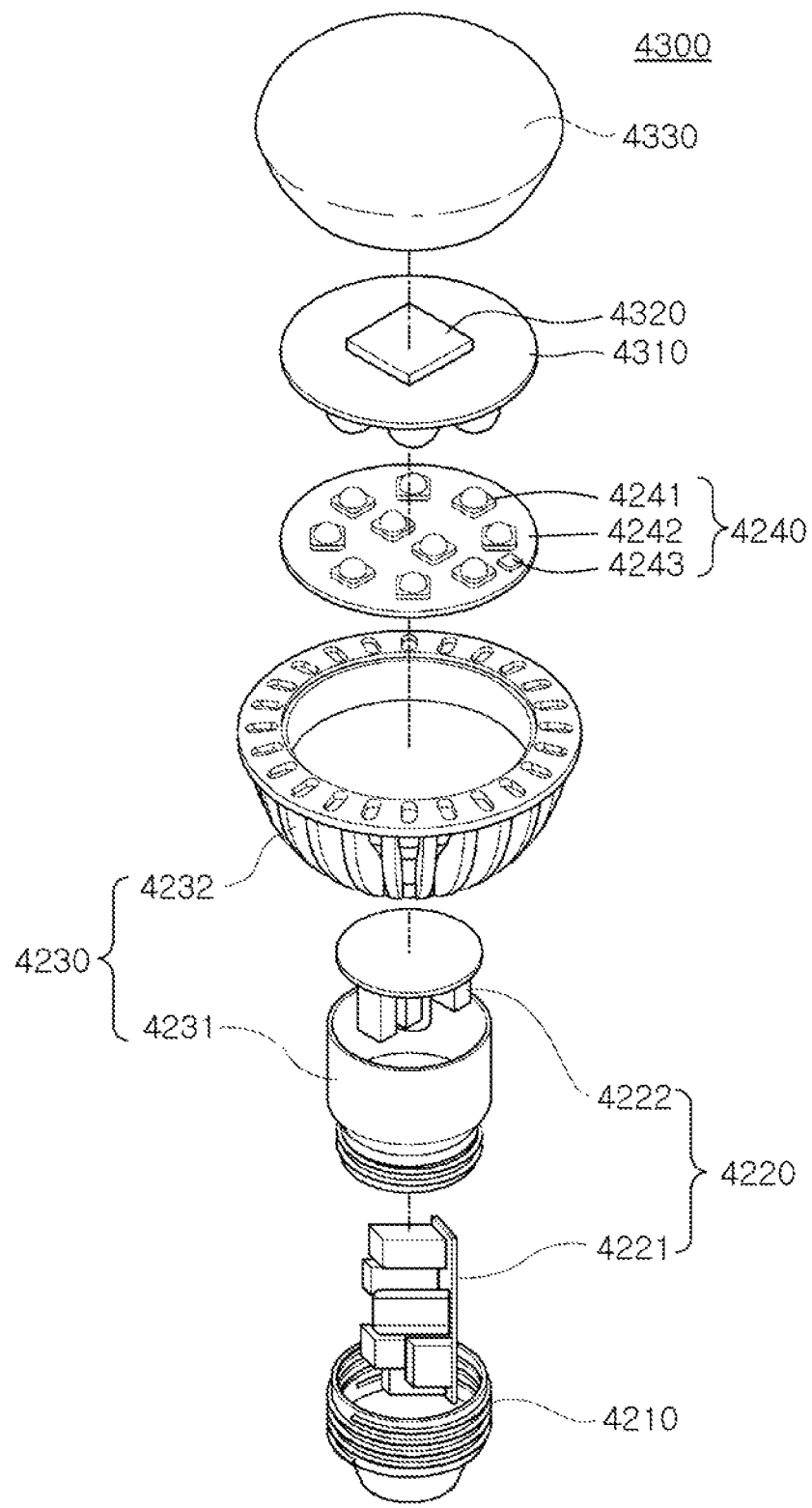

FIG. 29 is an exploded perspective view schematically illustrating a lamp, including a communications module, as a lighting apparatus, according to an exemplary embodiment of the present inventive concept.

In detail, a lighting apparatus 4300 according to the present exemplary embodiment is different from the lighting apparatus 4200 illustrated in FIG. 28, in that a reflective plate 4310 is provided above the light source module 4240, and here, the reflective plate 4310 serves to allow light from the light source to spread evenly toward the lateral and back sides thereof, and thereby glare may be reduced.

A communications module 4320 may be mounted on an upper portion of the reflective plate 4310, and home network communication may be realized through the communications module 4320. For example, the communications module 4320 may be a wireless communications module using ZigBee, Wi-Fi, or light fidelity (Li-Fi), and may control lighting installed within or outside of a household, such as turning on or off a lighting apparatus, adjusting brightness of a lighting apparatus, and the like, through a smartphone or a wireless controller. Also, home appliances or an automobile system within or outside of a household, such as a TV, a refrigerator, an air-conditioner, a door lock, or automobiles, and the like, may be controlled through a Li-Fi communications module using visible wavelengths of the lighting apparatus installed within or outside of the household.

The reflective plate 4310 and the communications module 4320 may be covered by a cover unit 4330.

Figure 30:
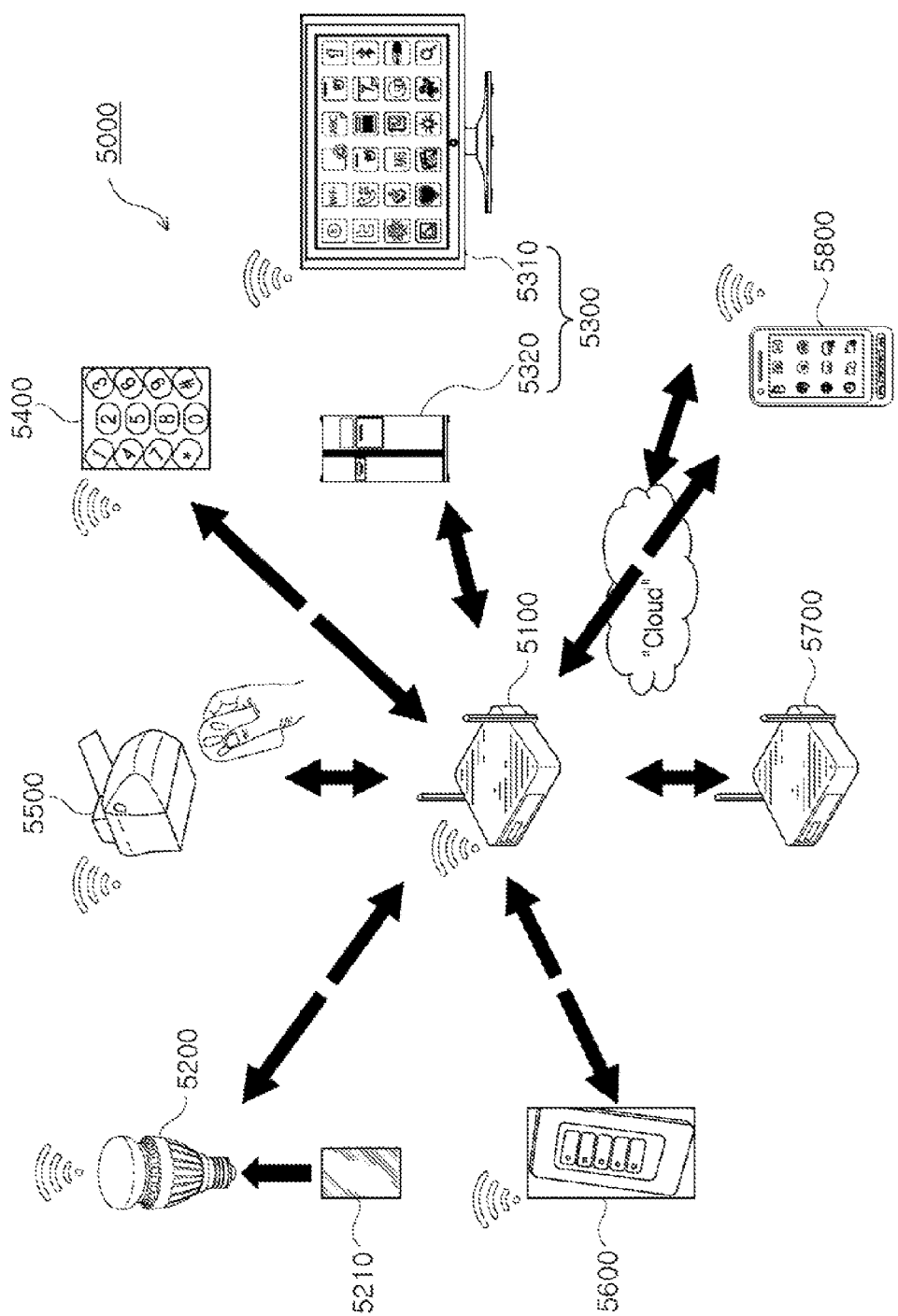
FIG. 30 through FIG. 32 are schematic views, each illustrating a lighting network system according to certain exemplary embodiments of the present inventive concept.
Figure 31:
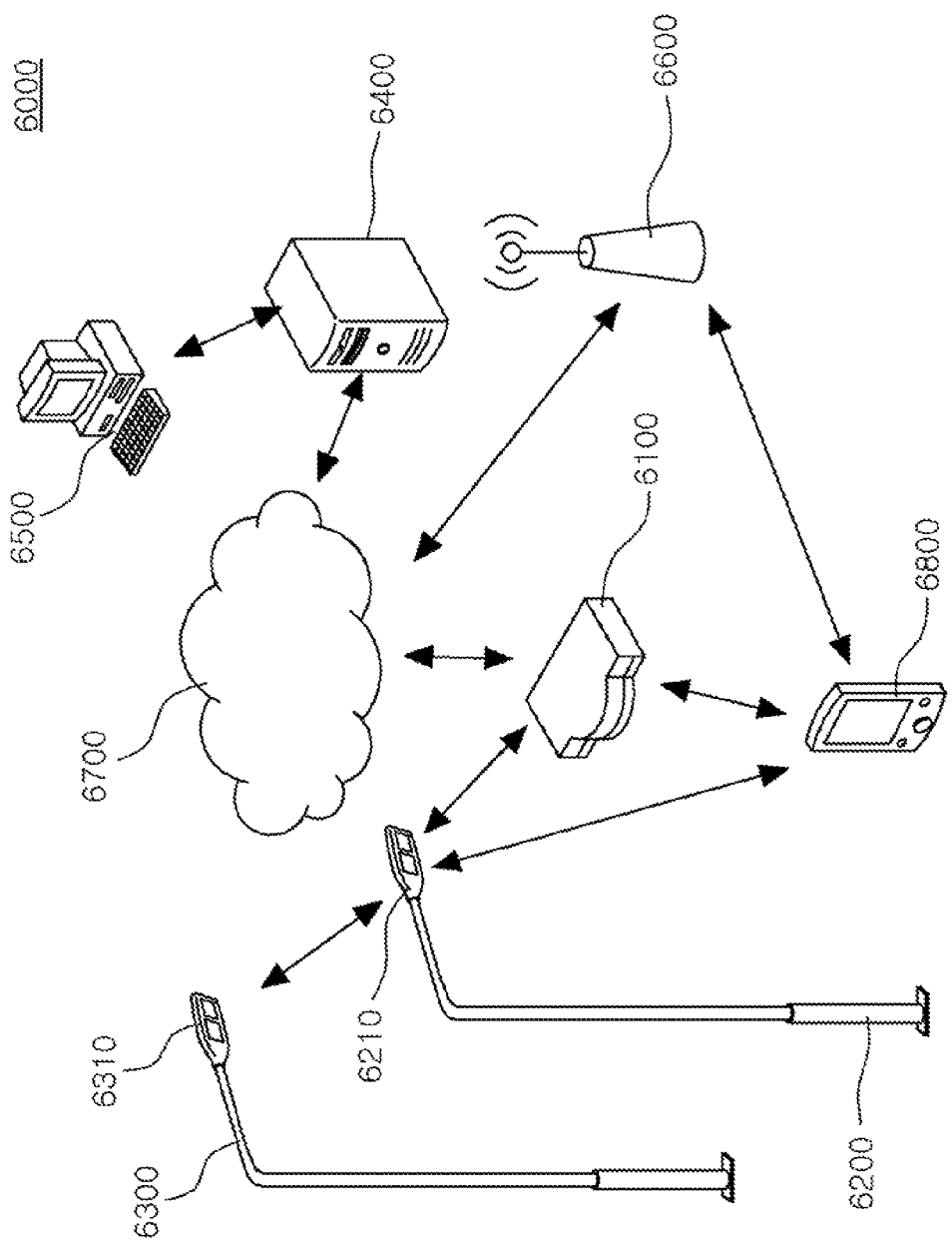
Figure 32:
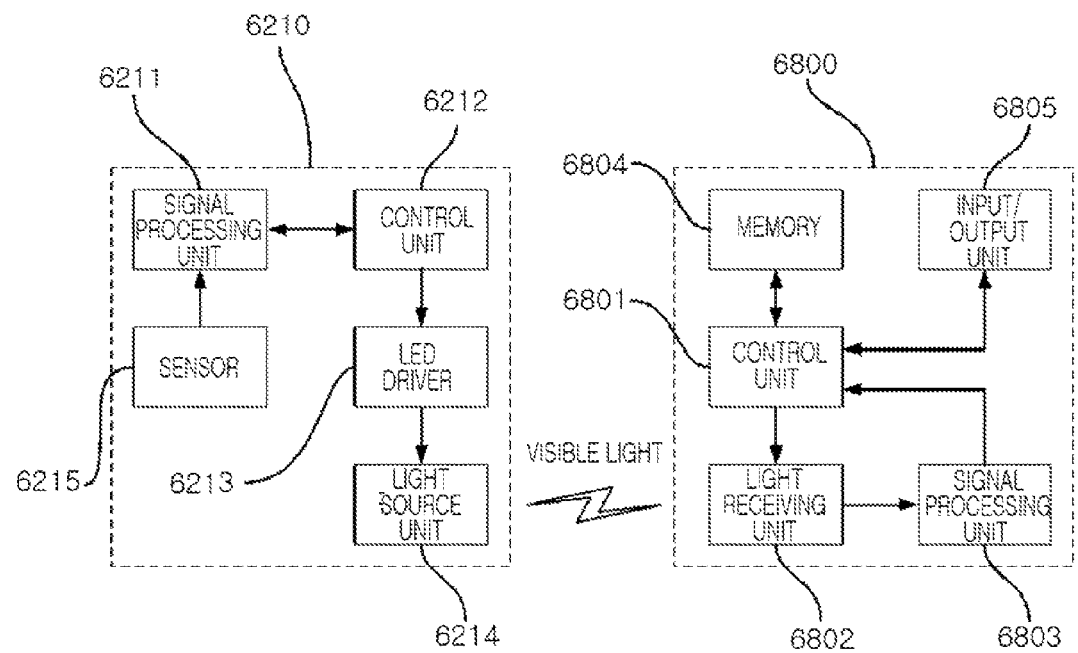

FIG. 30 through FIG. 32 are schematic views, each illustrating a network system including a light driving apparatus according to an exemplary embodiment of the present inventive concept.

FIG. 30 is a view schematically illustrating an indoor lighting control network system. A network system 5000 may be a complex smart lighting-network system combining lighting technology using a light emitting device such as an LED, or the like, Internet of Things (IoT) technology, wireless communications technology, and the like. The network system 5000 may be realized using various lighting apparatuses and wired/wireless communications devices, and may be realized by a sensor, a controller, a communications unit, software for network control and maintenance, and the like.

The network system 5000 may be applied even to an open space such as a park or a street, as well as to a closed space such as a home or an office. The network system 5000 may be realized on the basis of the IoT environment in order to collect and process a variety of information and provide the same to users. Here, an LED lamp 5200 included in the network system 5000 may serve not only to receive information regarding a surrounding environment from a gateway 5100 and control lighting of the LED lamp 5200 itself, but also to check and control operational states of other devices 5300 to 5800 included in the IoT environment on the basis of a function such as visible light communications, or the like, of the LED lamp 5200.

Referring to FIG. 30, the network system 5000 may include the gateway 5100 processing data transmitted and received according to different communications protocols, the LED lamp 5200 connected to be available for communicating with the gateway 5100 and including an LED light emitting device, and a plurality of devices 5300 to 5800 connected to be available for communicating with the gateway 5100 according to various wireless communications schemes. In order to realize the network system 5000 on the basis of the IoT environment, each of the devices 5300 to 5800, as well as the LED lamp 5200, may include at least one communications module. In an exemplary embodiment, the LED lamp 5200 may be connected to be available for communicating with the gateway 5100 according to wireless communication protocols such as Wi-Fi, ZigBee, or Li-Fi, and to this end, the LED lamp 5200 may include at least one communications module 5210 for a lamp.

As mentioned above, the network system 5000 may be applied even to an open space such as a park or a street, as well as to a closed space such as a home or an office. When the network system 5000 is applied to a home, the plurality of devices 5300 to 5800 included in the network system and connected to be available for communicating with the gateway 5100 on the basis of the IoT technology may include a home appliance 5300, a digital door lock 5400, a garage door lock 5500, a light switch 5600 installed on a wall, or the like, a router 5700 for relaying a wireless communication network, and a mobile device 5800 such as a smartphone, a tablet PC, or a laptop computer.

In the network system 5000, the LED lamp 5200 may check operational states of various devices 5300 to 5800 using the wireless communications network (ZigBee, Wi-Fi, LI-Fi, etc.) installed in a household or automatically control illumination of the LED lamp 5200 itself according to a surrounding environment or situation. Also, the devices 5300 to 5800 included in the network system 5000 may be controlled using Li-Fi communications using visible light emitted from the LED lamp 5200.

First, the LED lamp 5200 may automatically adjust illumination of the LED lamp 5200 on the basis of information of a surrounding environment transmitted from the gateway 5100 through the communications module 5210 for a lamp or information of a surrounding environment collected from a sensor installed in the LED lamp 5200. For example, brightness of illumination of the LED lamp 5200 may be automatically adjusted according to types of programs broadcast on the TV 5310 or brightness of a screen. To this end, the LED lamp 5200 may receive operation information of the TV 5310 from the communications module 5210 for a lamp connected to the gateway 5100. The communications module 5210 for a lamp may be integrally modularized with a sensor and/or a controller included in the LED lamp 5200.

For example, when a TV program broadcast is a drama, a color temperature of illumination may be decreased to be 12000K or lower, for example, to 5000K, and a color tone may be adjusted according to preset values, and thereby a cozy atmosphere is presented. Conversely, when a program value is a comedy program, the network system 5000 may be configured so that a color temperature of illumination is increased to 5000K or higher according to a preset value, and illumination is adjusted to white illumination based on a blue color.

Also, when no one is at home, and a predetermined time has lapsed after the digital door lock 5400 is locked, all of the turned-on LED lamps 5200 are turned off to prevent a waste of electricity. Also, when a security mode is set through the mobile device 5800, or the like, and the digital door lock 5400 is locked with no one at home, the LED lamp 5200 may be maintained in a turned-on state.

An operation of the LED lamp 5200 may be controlled according to surrounding environments collected through various sensors connected to the network system 5000. For example, when the network system 5000 is realized in a building, a lighting, a position sensor, and a communications module are combined in the building, and position information of people in the building is collected and the lighting is turned on or turned off, or the collected information may be provided in real time to effectively manage facilities or effectively utilize an idle space. In general, a lighting apparatus such as the LED lamp 5200 is disposed in almost every space of each floor of a building, and thus, various types of information of the building may be collected through a sensor integrally provided with the LED lamp 5200 and used for managing facilities and utilizing an idle space.

Meanwhile, the LED lamp 5200 may be combined with an image sensor, a storage device, and the communications module 5210 for a lamp, to be utilized as a device for maintaining building security, or sensing and coping with an emergency situation. For example, when a smoke or temperature sensor, or the like, is attached to the LED lamp 5200, a fire may be promptly sensed to minimize damage. Also, brightness of lighting may be adjusted in consideration of outside weather or an amount of sunshine, thereby saving energy and providing an agreeable illumination environment.

As described above, the network system 5000 may also be applied to an open space such as a street or a park, as well as to a closed space such as a home, an office, or a building. When the network system 5000 is intended to be applied to an open space without a physical limitation, it may be difficult to realize the network system 5000 due to a limitation in a distance of wireless communications or communications interference due to various obstacles. In this case, a sensor, a communications module, and the like, may be installed in each lighting fixture, and each lighting fixture may be used as an information collecting means or a communications relay means, whereby the network system 5000 may be more effectively realized in an open environment. This will hereinafter be described with reference to FIG. 31.

FIG. 31 is a view illustrating an embodiment of a network system 6000 applied to an open space. Referring to FIG. 31, a network system 6000 according to the present exemplary embodiment may include a communications connection device 6100, a plurality of lighting fixtures 6200 and 6300 installed at every predetermined interval and connected to be available for communicating with the communications connection device 6100, a server 6400, a computer 6500 managing the server 6400, a communications base station 6600, a communications network 6700, a mobile device 6800, and the like.

Each of the plurality of lighting fixtures 6200 and 6300 installed in an open outer space such as a street or a park may include smart engines 6210 and 6310, respectively. The smart engines 6210 and 6310 may include a light emitting device, a driver of the light emitting device, a sensor collecting information of a surrounding environment, a communications module, and the like. The smart engines 6210 and 6310 may communicate with other neighboring equipment by means of the communications module according to communications protocols such as Wi-Fi, ZigBee, and Li-Fi.

For example, one smart engine 6210 may be connected to communicate with another smart engine 6310. Here, a Wi-Fi extending technique (Wi-Fi mesh) may be applied to communications between the smart engines 6210 and 6310. The at least one smart engine 6210 may be connected to the communications connection device 6100 connected to the communications network 6700 by wired/wireless communications. In order to increase communication efficiency, some smart engines 6210 and 6310 may be grouped and connected to the single communications connection device 6100.

The communications connection device 6100 may be an access point (AP) available for wired/wireless communications, which may relay communications between the communications network 6700 and other equipment. The communications connection device 6100 may be connected to the communications network 6700 in either a wired manner or a wireless manner, and for example, the communications connection device 6100 may be mechanically received in any one of the lighting fixtures 6200 and 6300.

The communications connection device 6100 may be connected to the mobile device 6800 through a communications protocol such as Wi-Fi, or the like. A user of the mobile device 6800 may receive surrounding environment information collected by the plurality of smart engines 6210 and 6310 through the communications connection device 6100 connected to the smart engine 6210 of the lighting fixture 6200 adjacent to the mobile device 6800. The surrounding environment information may include nearby traffic information, weather information, and the like. The mobile device 6800 may be connected to the communications network 6700 according to a wireless cellular communications scheme such as 3G or 4G through the communications base station 6600.

Meanwhile, the server 6400 connected to the communications network 6700 may receive information collected by the smart engines 6210 and 6310 respectively installed in the lighting fixtures 6200 and 6300 and monitor an operational state, or the like, of each of the lighting fixtures 6200 and 6300. In order to manage the lighting fixtures 6200 and 6300 on the basis of the monitoring results of the operational states of the lighting fixtures 6200 and 6300, the server 6400 may be connected to the computer 6500 providing a management system. The computer 6500 may execute software, or the like, capable of monitoring and managing operational states of the lighting fixtures 6200 and 6300, specifically, the smart engines 6210 and 6310.

In order to transmit information collected by the smart engines 6210 and 6310 to the mobile device 6800 of the user, various communications schemes may be applied. Referring to FIG. 31, information collected by the smart engines 6210 and 6310 may be transmitted to the mobile device 6100 through the communications connection device 6100 connected to the smart engines 6210 and 6310, or the smart engines 6210 and 6310 and the mobile device 6800 may be connected to directly communicate with each other. The smart engines 6210 and 6310 and the mobile device 6800 may directly communicate with each other by visible light communications (Li-Fi). This will hereinafter be described with reference to FIG. 32.

FIG. 32 is a block diagram illustrating a communications operation between the smart engine 6210 of the lighting fixture 6200 and the mobile device 6800 according to visible light communications. Referring to FIG. 32, the smart engine 6210 may include a signal processing unit 6211, a control unit 6212, an LED driver 6213, a light source unit 6214, a sensor 6215, and the like. The mobile device 6800 connected to the smart engine 6210 by visible light communications may include a control unit 6801, a light receiving unit 6802, a signal processing unit 6803, a memory 6804, an input/output unit 6805, and the like.

The visible light communications (VLC) technology (or light fidelity (Li-Fi)) is a wireless communications technology transferring information wirelessly by using light having a visible light wavelength band recognizable to the naked eye. The visible light communications technology is distinguished from the existing wired optical communications technology and the infrared data association (IrDA) in that it uses light having a visible light wavelength band, namely, a particular visible light frequency from the light emitting device package according to the exemplary embodiment described above and is distinguished from the existing wired optical communications technology in that a communications environment is based on a wireless scheme. Also, unlike RF wireless communications, the VLC technology (or Li-Fi) has excellent convenience because it can be used without being regulated or authorized in the aspect of frequency usage, and VLC technology (or Li-Fi) has a distinction of having excellent physical security and a user's verification of a communication link with his or her own eyes. Most of all, VLC technology (or Li-Fi) is differentiated in that it has features as a convergence technology that obtains both a unique purpose as a light source and a communications function.

Referring to FIG. 32, the signal processing unit 6211 of the smart engine 6210 may process data intended to be transmitted and received by VLC. In an exemplary embodiment, the signal processing unit 6211 may process information collected by the sensor 6215 into data and transmit the processed data to the control unit 6212. The control unit 6212 may control operations of the signal processing unit 6211, the LED driver 6213, and the like, and in particular, the control unit 6212 may control an operation of the LED driver 6213 on the basis of data transmitted from the signal processing unit 6211. The LED driver 6213 emits the light source unit 6214 according to a control signal transmitted from the control unit 6212, thereby transmitting data to the mobile device 6800.

The mobile device 6800 may include the light receiving unit 6802 for recognizing visible light including data, in addition to the control unit 6801, the memory 6804 storing data, the input/output unit 6805 including a display, a touchscreen, an audio output unit, and the like, and the signal processing unit 6803. The light receiving unit 6802 may sense visible light and convert the sensed visible light into an electrical signal, and the signal processing unit 6803 may decode data included in the electrical signal converted by the light receiving unit 6802. The control unit 6801 may store the data decoded by the signal processing unit 6803 in the memory 6804 or may output the decoded data through the input/output unit 6805 to allow the user to recognize the data.

As set forth above, according to exemplary embodiments of the present inventive concept, an LED driving apparatus and a lighting apparatus in which a converter circuit may be omitted because an LED array is directly connected to a rectifier circuit to emit light, and in particular, a portion of a current flowing in the LED array may be dispersed to drive a high output LED, may be provided.

While exemplary embodiments have been shown and described above, it will be apparent to those skilled in the art that modifications and variations could be made without departing from the scope of the invention as defined by the appended claims.

What is claimed is:
1. A light emitting device driving apparatus, comprising:
a rectifier circuit configured to rectify alternating current (AC) power to generate driving power for operating a plurality of LED arrays;
a controller integrated circuit (IC) including a plurality of internal switches connected to respective output terminals of the plurality of light emitting diode (LED) arrays and configured to control a path of a current flowing in the plurality of LED arrays by adjusting operations of the plurality of internal switches according to a magnitude of the driving power; and
a current controlling circuit connected to the output terminal of at least one of the plurality of LED arrays and configured to control a current flowing in the at least one LED array,
wherein the plurality of LED arrays includes:
a first LED array having an input node that receives a current from an output node of the rectifier circuit;
a last LED array having an output node that outputs a current to an input node of the current controlling circuit, the output node being the output terminal; and
one or more LED arrays connected between the first LED array and the last LED array, such that adjacent LED arrays are connected by an intermediate node that is connected to a terminal of a respective internal switch of the plurality of internal switches, and wherein the plurality of internal switches include:
a set of switches respectively connected at an input end to corresponding intermediate nodes, and commonly connected at an output end to a common node, wherein the common node is a node of the controller IC connected to the current controlling circuit, and
a last switch connected at an input end to the output node of the last LED, and at an output end to the common node,
wherein the current controlling circuit includes at least a voltage divider having one end connected to the common node, and a second end connected to ground, such that when the last switch is closed, a current output from the last LED array passes through the last switch and the voltage divider.

2. The light emitting device driving apparatus of claim 1, wherein the current controlling circuit is connected to at least the last switch of the plurality of internal switches at the output node of the last LED array.

3. The light emitting device driving apparatus of claim 2, configured so that when the last switch is in a closed state, the current flowing in the at least one LED array is dispersed into the current controlling circuit and the last switch.

4. The light emitting device driving apparatus of claim 1, wherein the current controlling circuit includes an external switching element connected to the output node of the last LED array, a first resistor connected between an output terminal of the external switching element and the last switch, and a second resistor connected between a ground terminal and the output terminal of the external switching element.

5. The light emitting device driving apparatus of claim 4, configured such that a ratio of a current flowing in the current controlling circuit and a current flowing in the at least one internal switch is determined by a ratio of the first resistor and the second resistor.

6. The light emitting device driving apparatus of claim 1, wherein at least some of the plurality of LED arrays include different numbers of light emitting devices as other of the plurality of LED arrays.

7. The light emitting device driving apparatus of claim 6, wherein the at least one LED array includes a smaller number of light emitting devices than that of the remaining LED arrays of the plurality of LED arrays.

8. The light emitting device driving apparatus of claim 1, configured such that a time for which the at least one LED array emits light in a single cycle of the driving power is shorter than a time for which the remaining LED arrays of the plurality of LED arrays emit light in the single cycle of the driving power.

9. The light emitting device driving apparatus of claim 1, wherein at least one of the LED arrays is directly electrically connected to the rectifier circuit, and further comprising: a voltage detecting circuit configured to detect a voltage magnitude of the driving power.

10. A lighting apparatus, comprising:
a light source including a plurality of light emitting diode (LED) arrays including a first LED array through which an applied current flows first, and a last LED array through which the applied current flows last;
a controller integrated circuit (IC) including a plurality of internal switches connected to respective output terminals of the plurality of LED arrays and configured to control a path of a current flowing in the plurality of LED arrays by adjusting operations of the plurality of internal switches according to a magnitude of the driving power; and
a current controlling circuit connected to the output terminal of the last LED array of the plurality of LED arrays and configured to draw a current flowing in the controller IC,
wherein the current controlling circuit includes at least a voltage divider connected to the last switch, such that when the last switch is closed, a current output from the last LED array passes through the last switch and the voltage divider.

11. The lighting apparatus of claim 10, wherein a time for which the last LED array emits light in a single cycle of the driving power is shorter than a time for which the remaining LED arrays of the plurality of LED arrays emit light in the single cycle of the driving power.

12. The lighting apparatus of claim 10, wherein the last LED array is configured to be turned on together with the remaining LED arrays of the plurality of LED arrays during at least part of the single cycle of the driving power.

13. The lighting apparatus of claim 10, wherein the current controlling circuit includes an external switching element connected to the output terminal of the last LED array, a first resistor connected between an output terminal of the external switching element and the at least one internal switch, and a second resistor connected between a ground terminal and the output terminal of the external switching element.

14. The lighting apparatus of claim 13, configured such that a ratio of a current flowing in the current controlling circuit and a current flowing in the last internal switch is determined by a ratio of the first resistor and the second resistor.

15. A lighting apparatus, comprising:
a rectifier circuit configured to rectify alternating current (AC) power to generate driving power for operating a plurality of light emitting device sets, each light emitting device set having an input terminal and output terminal and including one or more light emitting devices, the light emitting device sets including a first light emitting device set through which an applied current flows first, and a last light emitting device array through which the applied current flows last;
a controller integrated circuit (IC) including a plurality of internal switches connected to respective output terminals of the plurality of light emitting device sets and configured to control a path of a current flowing in the plurality of light emitting device sets by adjusting operations of the plurality of internal switches according to a magnitude of the driving power, wherein a last internal switch is connected to the output terminal of the last light emitting device set; and
a current controlling circuit connected to the output terminal of the last light emitting device set of the plurality of light emitting device sets and configured to control a current flowing in the at least one light emitting device set,
wherein one node of the current controlling circuit is connected in common to the output terminal of the last light emitting device set and to an input terminal of the last internal switch, and another node of the current controlling, circuit is connected to ground through a voltage divider.

16. The light emitting device driving apparatus of claim 15, wherein the light emitting device sets are light emitting diode (LED) arrays.

17. The light emitting device driving apparatus of claim 15, wherein the current controlling circuit is connected between a first terminal of the last internal switch of the plurality of internal switches and a second terminal of the last internal switch of the plurality of internal switches.

18. The light emitting device driving apparatus of claim 17, wherein the current controlling circuit includes a voltage divider connected between the first terminal of the last internal switch and a ground, and further includes at least one switch connected to the second terminal of the last internal switch.

\* \* \* \* \*